(12) United States Patent
Abiko et al.

(10) Patent No.: US 10,204,987 B2
(45) Date of Patent: Feb. 12, 2019

(54) SEMICONDUCTOR DEVICE AND MANUFACTURING METHOD FOR THE SEMICONDUCTOR DEVICE

(71) Applicant: Renesas Electronics Corporation, Koutou-ku, Tokyo (JP)

(72) Inventors: Yuya Abiko, Ibaraki (JP); Satoshi Eguchi, Ibaraki (JP); Akio Ichimura, Ibaraki (JP); Natsuo Yamaguchi, Ibaraki (JP); Tetsuya Iida, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/869,023

(22) Filed: Jan. 11, 2018

(65) Prior Publication Data
US 2018/0158910 A1 Jun. 7, 2018

Related U.S. Application Data

(62) Division of application No. 14/965,899, filed on Dec. 11, 2015, now Pat. No. 9,905,644.

(30) Foreign Application Priority Data

Jan. 8, 2015 (JP) .................. 2015-002664

(51) Int. Cl.
*H01L 21/31* (2006.01)
*H01L 29/06* (2006.01)
(Continued)

(52) U.S. Cl.
CPC .. *H01L 29/0696* (2013.01); *H01L 21/823412* (2013.01); *H01L 21/823418* (2013.01);
(Continued)

(58) Field of Classification Search
CPC . H01L 29/06; H01L 29/0684; H01L 29/0692; H01L 29/0696; H01L 29/1095;
(Continued)

(56) References Cited

U.S. PATENT DOCUMENTS 7,737,469 B2 6/2010 Saito et al.
2002/0074596 A1 6/2002 Suzuki et al.
(Continued)

FOREIGN PATENT DOCUMENTS

JP 2007-335844 A 12/2007

OTHER PUBLICATIONS

Extended European search report for European Patent Application No. 15190523.9, dated May 20, 2016.
(Continued)

*Primary Examiner* — Eduardo A Rodela
(74) *Attorney, Agent, or Firm* — Sharpiro, Gabor and Rosenberger, PLLC

(57) ABSTRACT

In a semiconductor device including a super junction structure that p-type columns and n-type columns are periodically arranged, a depth of a p-type column region in a cell region that a semiconductor element is formed is made shallower than a depth of a p-type column region in an intermediate region which surrounds the cell region. Thereby, a breakdown voltage of the cell region becomes lower than a breakdown voltage of the intermediate region. An avalanche breakdown phenomenon is caused to occur preferentially in the cell region in which even when an avalanche current is generated, the current is dispersed and smoothly flows. Thereby, it is possible to avoid local current constriction and breakage incidental thereto and consequently it becomes possible to improve avalanche resistance (an avalanche current amount with which a semiconductor device comes to be broken).

4 Claims, 29 Drawing Sheets

(51) Int. Cl.
*H01L 21/8234* (2006.01)
*H01L 27/06* (2006.01)
*H01L 29/417* (2006.01)
*H01L 29/739* (2006.01)
*H01L 29/66* (2006.01)
*H01L 29/78* (2006.01)
*H01L 29/08* (2006.01)
*H01L 29/10* (2006.01)

(52) U.S. Cl.
CPC .. *H01L 21/823487* (2013.01); *H01L 27/0688* (2013.01); *H01L 29/06* (2013.01); *H01L 29/0634* (2013.01); *H01L 29/0684* (2013.01); *H01L 29/0878* (2013.01); *H01L 29/1095* (2013.01); *H01L 29/41741* (2013.01); *H01L 29/66727* (2013.01); *H01L 29/7393* (2013.01); *H01L 29/7395* (2013.01); *H01L 29/7811* (2013.01)

(58) Field of Classification Search
CPC ............ H01L 29/66325; H01L 29/732; H01L 29/7393; H01L 29/7395; H01L 29/7397; H01L 21/02269; H01L 21/02293; H01L 21/02694; H01L 21/20; H01L 21/2018; H01L 21/2205; H01L 21/66287
See application file for complete search history.

(56) References Cited

U.S. PATENT DOCUMENTS

| | | |
|---|---|---|
| 2002/0088990 A1* | 7/2002 | Iwamoto ............ H01L 29/0634 257/136 |
| 2002/0171093 A1 | 11/2002 | Onishi et al. |
| 2003/0176031 A1 | 9/2003 | Onishi et al. |
| 2004/0124464 A1 | 7/2004 | Narazaki |
| 2007/0272953 A1* | 11/2007 | Hirler ................ H01L 29/0634 257/285 |
| 2008/0315297 A1 | 12/2008 | Takashita et al. |
| 2011/0101446 A1 | 5/2011 | Guan et al. |
| 2012/0061721 A1* | 3/2012 | Kimura ............... H01L 29/0634 257/133 |
| 2012/0126328 A1 | 5/2012 | Lin |
| 2012/0326226 A1 | 12/2012 | Xiao |
| 2013/0037852 A1* | 2/2013 | Tamaki ............... H01L 29/7811 257/139 |
| 2013/0200499 A1 | 8/2013 | Liaw et al. |
| 2014/0151785 A1 | 6/2014 | Akagi et al. |
| 2014/0291773 A1* | 10/2014 | Lin ........................ H01L 29/78 257/409 |
| 2015/0333153 A1* | 11/2015 | Eguchi ................ H01L 29/0615 438/270 |

OTHER PUBLICATIONS

Office Action issued Oct. 9, 2018 in Japanese Patent Application No. 2015-002664.

* cited by examiner

SEMICONDUCTOR DEVICE AND MANUFACTURING METHOD FOR THE SEMICONDUCTOR DEVICE

CROSS-REFERENCE TO RELATED APPLICATIONS

The disclosure of Japanese Patent Application No. 2015-002664 filed on Jan. 8, 2015 including the specification, drawings and abstract is incorporated herein by reference in its entirety.

BACKGROUND

The present invention relates to a semiconductor device and a manufacturing method for the semiconductor device and is favorably utilized in, for example, a power semiconductor device and a manufacturing method for the power semiconductor device.

In the field of vertical-type power MOSFETs, that is, the power semiconductor devices, adoption of a super junction structure is now being examined in order to suppress on-resistance while maintaining a breakdown voltage.

For example, in Japanese Unexamined Patent Application Publication No, 2007-335844, there is disclosed a semiconductor device which has adopted the super junction structure in a cell region and a peripheral region. Then, semiconductor pillar regions having the super junction structure are formed such that the closer to the termination of each of the cell and intermediate regions the semiconductor pillar region is located, the more the depth thereof is reduced stepwise.

SUMMARY

The present inventors and others are engaged in research and development of a novel vertical-type power MOSFET which has adopted the super junction structure and keenly examine improvement of the performance thereof. In the process of the research and development of the above-mentioned novel vertical-type power MOSFET, it was found that in order to further improve the performance of the novel vertical power MOSFET which has adopted the super junction structure, there is room for improvement in relation to the structure of the vertical-type power MOSFET and a manufacturing method for the same.

Other drawbacks to be solved and novel features of the present invention will become apparent from description of the specification and the appended drawings of the present invention.

An outline of typical embodiments in the embodiments disclosed in the present application will be briefly described as follows.

A semiconductor device according to one embodiment disclosed in the present application includes a plurality of first conductivity type first pillars formed in a semiconductor layer in a first region, a semiconductor element formed over the semiconductor layer in the first region and a plurality of first conductivity type third pillars formed in the semiconductor layer in a second region. Then, a depth of each first pillar which is a depth of a first conductivity type region in a first ditch is made shallower than a depth of each third pillar which is a depth of a first conductivity type region in a second ditch.

A manufacturing method for the semiconductor device according to one embodiment disclosed in the present application includes the step of embedding a semiconductor of a second conductivity type which is the reverse conductivity type of the first conductivity type in the first ditch and the second ditch, and thereby forming the first pillar in the first ditch and forming the third pillar in the second groove. Then, the manufacturing method for the semiconductor device further includes the step of implanting a first conductivity type impurity into a lower part of the first pillar in the first ditch. This step is the step of implanting the first conductivity type impurity into the first pillar in a state where the bottom side of the first ditch in the semiconductor layer is turned upward as an upper surface and the second region is being covered with a mask.

According to the semiconductor device described in the following typical embodiments disclosed in the present application, it is possible to improve the performance of the semiconductor device.

According to the manufacturing method for the semiconductor device described in the following typical embodiments disclosed in the present application, it is possible to manufacture the semiconductor device which is favorable in characteristics.

DETAILED DESCRIPTION

Figure 1:
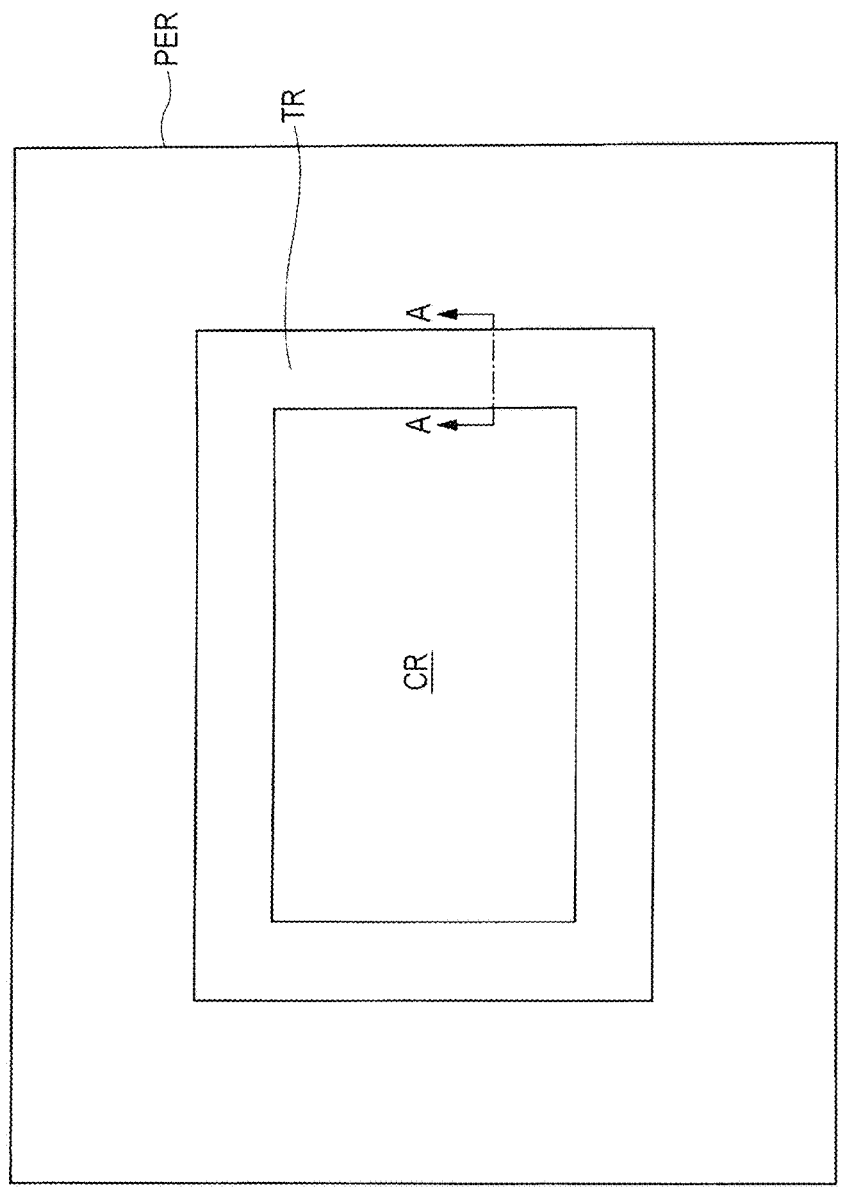
FIG. 1 is a plan view schematically illustrating one example of a configuration of a semiconductor device according to a first embodiment.

Although, in the following embodiments, description will be made by dividing into a plurality of sections or embodiments when necessary for the convenience sake, these are not unrelated to each another and these are related to each other such that one covers some or all of modified examples, application examples, detailed explanation, supplemental explanation and so forth of the other unless otherwise clearly stated. In addition, in the following embodiments, in a case where a number of constitutional elements and so forth (a number of units, a numerical value, an amount/a quantity, a range and so forth are included) is referred to, it is not limited to the specific number and may be at least and/or not more than the specific number unless otherwise clearly stated in particular and unless otherwise definitely limited to the specific number in principle.

In addition, in the following embodiments, the constitutional element (element steps and so forth are also included) is not necessarily indispensable unless otherwise clearly stated and unless otherwise thought to be clearly indispensable in principle. Likewise, in the following embodiments, when the shapes of the constitutional elements and so forth, a positional relationship among them and so forth are referred to, the ones that are substantially approximate or similar to the shapes and so forth will be included unless otherwise clearly stated and unless otherwise clearly thought that it is not so in principle. The same also applies to the above-mentioned number of elements and so forth (the number of units, the numerical value, the amount/the quantity, the range and so forth).

In the following, the embodiments of the present invention will be described in detail on the basis of the drawings. Incidentally, in all of the drawings depicted in order to describe the embodiments, the same or relevant numerals are assigned to members having the same function and repetitive description thereof is omitted. In addition, in a case where there exist a plurality of similar members (parts), there are cases where a symbol is added to a general mark so as to indicate a discrete or specific part. In addition, in the following embodiments, description on the same or similar part will not be repeated in principle unless otherwise necessary.

In addition, in the drawings used in the embodiments, there are cases where hatching is omitted even in a sectional diagram for easy viewing of the drawings. In addition, there are cases where hatching is added even in a plan view for easy viewing of the drawings.

In addition, in the sectional diagrams and the plan views, there are cases where the size of each part does not correspond to the size of an actual device and a specific part is displayed in a relatively enlarged size for easy understanding of the drawings. In addition, also in a case where the sectional diagram is illustrated corresponding to the plan view, there are cases where the specific part is displayed in the relatively enlarged size for easy understanding of the drawings.

First Embodiment

[Description on Structure]

Figure 2:
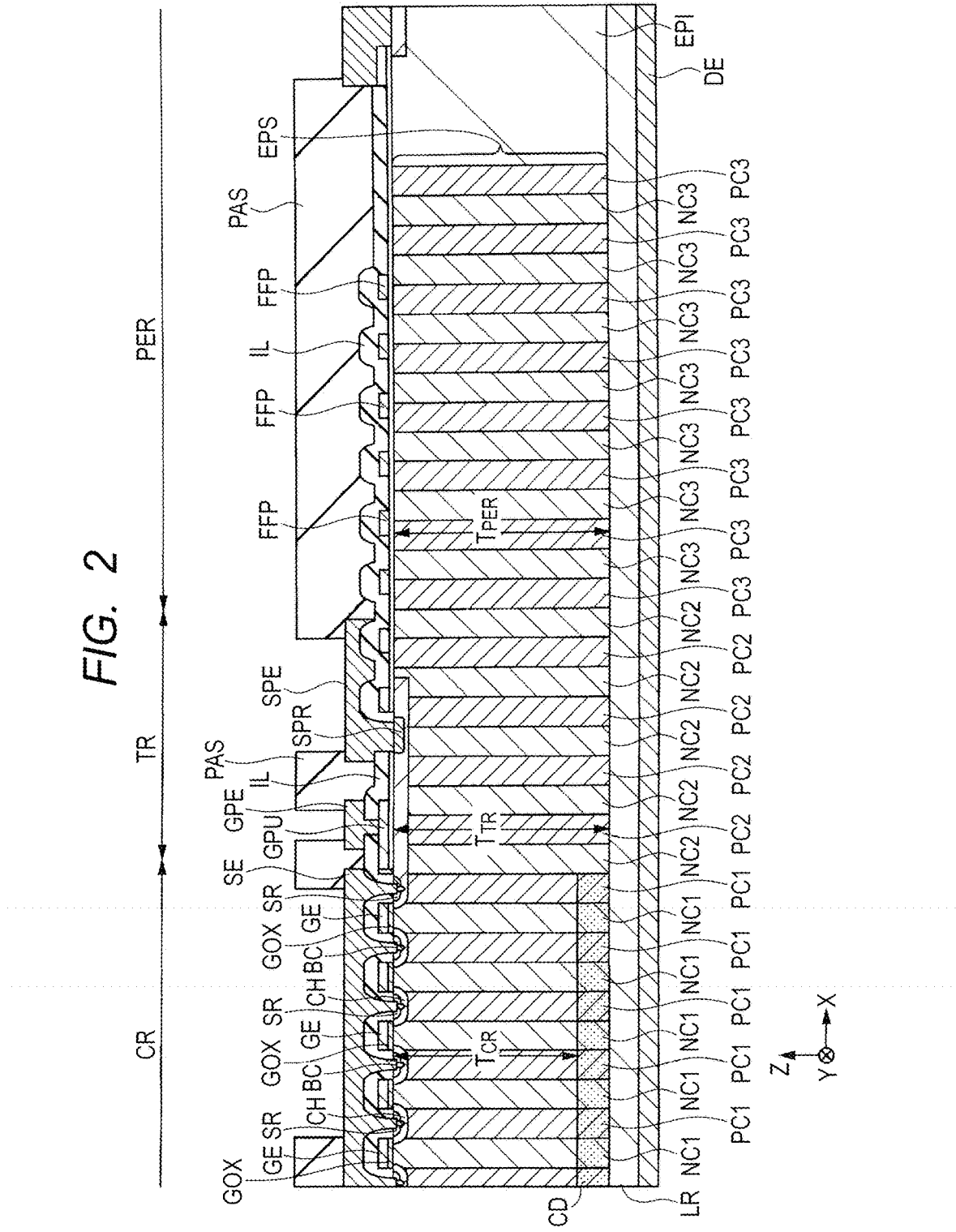
FIG. 2 is a sectional diagram illustrating one example of the configuration of the semiconductor device according to the first embodiment.
Figure 3:
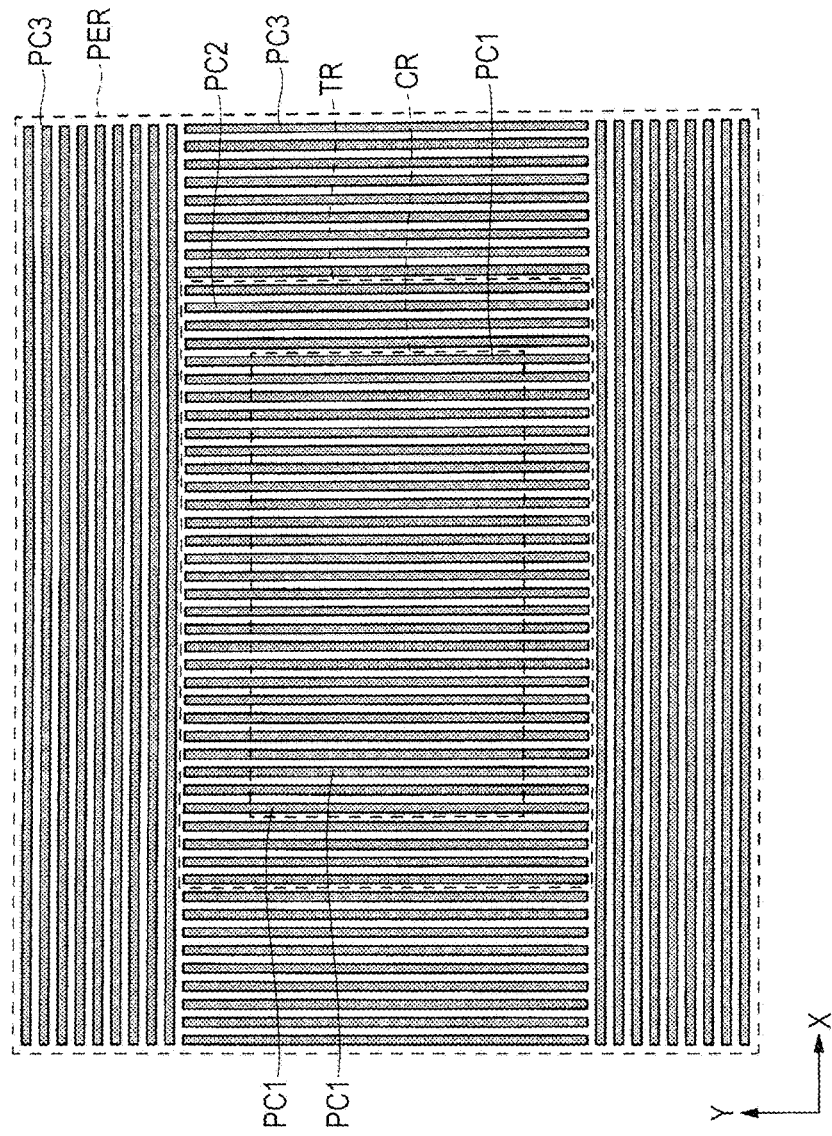
FIG. 3 is a plan view illustrating one example of a configuration of p-type column regions of the semiconductor device according to the first embodiment.

FIG. 1 is a plan view schematically illustrating one example of a configuration of a semiconductor device according to the present embodiment. FIG. 2 is a sectional diagram illustrating one example of the configuration of the semiconductor device according to the present embodiment. The section illustrated in FIG. 2 corresponds to, for example, a section A-A in FIG. 1. The semiconductor device (a semiconductor element) according to the present embodiment is a vertical-type power MOSFET (Metal Oxide Semiconductor Field Effect Transistor). The MOSFET is sometimes called a MISFET (Metal Insulator Semiconductor Field Effect Transistor). FIG. 3 is a plan view illustrating one example of a configuration of p-type column regions of the semiconductor device according to the present embodiment.

As illustrated in FIG. 1, the semiconductor device (a semiconductor chip) according to the present embodiment is rectangular when viewed planarly from above. Then, the semiconductor device according to the present embodiment includes a cell region CR, an intermediate region (also called a termination part, a terminal part and so forth) TR and a peripheral region PER. The cell region CR is arranged on a central part of the almost rectangular semiconductor device, the intermediate region TR is arranged so as to surround the outer periphery of the cell region CR and the peripheral region PER is arranged so as to surround the intermediate region TR. In the following, configurations of the respective regions of the semiconductor device will be described with reference to FIG. 2.

(1) Structure of Cell Region CR

As illustrated in FIG. 2, a power MOSFET is formed in the cell region CR. The power MOSFET is formed over a principal surface of an epitaxial layer EPS formed over a semiconductor substrate 1S (in FIG. 2, corresponding to an n-type semiconductor region LR). The epitaxial layer EPS includes a plurality of p-type column regions (also called p-type pillars, pillars and so forth) PC1 and a plurality of n-type column regions (also called n-type pillars, pillars and so forth) NC1. The p-type column regions PC1 and the n-type column regions NC1 are alternately arranged in an X direction. A structure that the p-type column regions PC1 and the n-type column regions NC1 so configured are periodically arranged is called a super junction structure. As illustrated in FIG. 3, the p-type column region PC1 is linear in shape (a rectangle having the long side in a Y direction) when viewed planarly from above.

For example, here, the cell region CR is designed such that a width (a dimension in the X direction) and a depth (a dimension in the Y direction) of the p-type column region PC1 become respectively the same as a width (the dimension in the X direction) and a depth (the dimension in the Y direction) of the n-type column region NC1.

The n-type column region NC1 is, for example, pillar-shaped and is configured by a semiconductor region (an epitaxial layer) that an n-type impurity such as phosphorus (P), arsenic (As) or the like has been introduced. A concentration of the n-type impurity in the n-type column region NC1 is, for example, about $3.0\times10^{15}/cm^3$. A drain region of the power MOSFET is configured by the n-type column region NC1 and the semiconductor substrate 1S. Each n-type column region NC1 is sandwiched by two p-type column regions PC1. The plurality of n-type column regions NC1 are arranged separately from one another by the width (the dimension in the X direction) of one p-type column region PC1.

The p-type column region PC1 is, for example, pillar-shaped and is configured by a semiconductor region that a p-type impurity such as boron (B) or the like has been introduced. A concentration of the p-type impurity in the p-type column region PC1 is, for example, about $3.0\times10^{15}/cm^3$. Each p-type column region PC1 is sandwiched by two n-type column regions NC1. The plurality of p-type column regions PC1 are arranged separately from one another by the width (the dimension in the X direction) of one n-type column region NC1.

The power MOSFET is formed over the principal surface of a structural body (the epitaxial layer EPS) that the p-type column regions PC1 and the n-type column regions NC1 so configured are periodically arranged.

The power MOSFET includes a gate electrode GE which is arranged over the n-type column region NC1 via a gate insulating film GOX. As the gate insulating film GOX, for example, a silicon oxide film and so forth may be used. In addition, as the gate insulating film GOX, for example, a high-permittivity film and so forth which are higher in permittivity than the silicon oxide film may be used, in addition to the silicon oxide film. In addition, as the gate electrode GE, for example, a polycrystalline silicon film and so forth may be used.

Channel regions CH are arranged over upper parts of the p-type column regions PC1 on the both sides of the gate electrode GE. A source region SR is arranged so as to be contained in each channel region CH. The channel region CH is configured by a semiconductor region that the p-type impurity such as, for example, boron (B) or the like has been introduced and the source region SR is configured by a semiconductor region that the n-type impurity such as, for example, phosphorous (P), arsenic (As) or the like has been introduced. As described above, the drain region of the power MOSFET is configured by the n-type column NC1 and the semiconductor substrate 1S.

When a potential has been applied to the gate electrode GE of the power MOSFET, carriers (electrons) flow from the source region SR to the drain region (the n-type column region NC1 and the semiconductor substrate 1S (LR)) via an inversion layer formed in the channel region CH. In other words, an electric current flows from the drain region (the n-type column region NC1 and the semiconductor substrate 1S (LR)) to the source region SR via the inversion layer formed in the channel region CH.

The gate electrode GE which extends in the Y direction, the n-type column region NC1 arrang0ed under the gate electrode GE and the source regions SR formed on the both sides of the n-type column region NC1 are configured as one unit cell and the unit cells so configured are repetitively arranged. The plurality of unit cells are coupled in parallel with one another and thereby one power MOSFET is formed.

In addition, a body contact region BC which extends from an upper surface of the epitaxial layer EPS and reaches the channel region CH is formed over a central part of the source region SR. The body contact region BC is configured by the semiconductor region that the p-type impurity such as, for example, boron (B) or the like has been introduced. The impurity concentration of the body contact region BC is made higher than the impurity concentration of the channel region CH.

An upper surface and sidewalls on the both sides of the gate electrode GE are covered with an interlayer insulating film IL. As the interlayer insulating film IL, for example, the silicon oxide film and so forth may be used. The interlayer insulating film IL formed over the body contact region BC and the source regions SR located on the both sides of the body contact region BC is removed and a contact hole is formed. A source electrode SE is formed over the contact hole and the interlayer insulating film IL. As the source electrode SE, a laminated film which includes a barrier conductor film configured by, for example, a titanium tungsten film and so forth and a main conductor film which is laminated on the barrier conductor film and configured by, for example, an aluminum film and so forth may be used.

Thereby, the source electrode SE comes to be electrically coupled with the source region SR and also comes to be electrically coupled with the channel region CH via the body contact region BC. The body contact region BC has a function of ensuring an ohmic contact with the source electrode SE and the source region SR and the channel region CH come to be electrically coupled together at the same potential owing to presence of the body contact region BC.

Therefore, it is possible to suppress an on-operation of a parasitic n-p-n bipolar transistor that the source region SR is used as an emitter region, the channel region CH is used as a base region and the n-type column region NC1 is used as a collector region. That is, that the source region SR and the channel region CH are electrically coupled together at the same potential means that a potential difference is not generated between the emitter region and the base region of the parasitic n-p-n bipolar transistor and thereby it is possible to suppress the on-operation of the parasitic n-p-n bipolar transistor.

A surface protective film PAS is arranged over the source electrode SE so as to partially cover the source electrode SE. As the surface protective film PAS, for example, the silicon oxide film and so forth may be used. A partial region of the source electrode SE is exposed from the surface protective film PAS. In addition, a drain electrode DE configured by, for example, a metal film and so forth is arranged over the back surface (a surface opposite to the principal surface over which the epitaxial layer EPS is formed).

(2) Structure of Intermediate Region TR

As illustrated in FIG. 2, a gate pull-out unit GPU, a gate pull-out electrode GPE, a source pull-out region SPR, a source pull-out electrode SPE and so forth are formed in the intermediate region TR.

The gate pull-out unit GPU and the gate pull-out electrode GPE are arranged over the epitaxial layer EPS formed over the semiconductor substrate 1S. The source pull-out region SPR is arranged over an upper part of the epitaxial layer EPS.

Also in the intermediate region TR, p-type column regions PC2 and n-type column regions NC2 are periodically arranged. In other words, as illustrated in FIG. 3, in the rectangular region that the linear p-type column regions PC2 and the linear n-type column regions NC2 are alternately arranged, an outer peripheral region of the central cell region CR serves as the intermediate region TR. Therefore, the linear p-type column regions PC2 and the linear n-type column regions NC2 are alternately arranged along sides (right and left sides in FIG. 3) which extend in the Y direction of the intermediate region TR. In addition, upper and lower ends of the linear p-type column regions PC2 and of the n-type column regions NC2 which respectively extend from the cell region CR upward and downward are alternately arranged along sides (upper and lower sides in FIG. 3) which extend in the X direction of the intermediate region TR.

A structural body (the epitaxial layer EPS) that the p-type column regions PC2 and the n-type column regions NC2 are periodically arranged in the intermediate region TR in this way is configured in the same manner as the structural body (the epitaxial layer EPS) that the p-type column regions PC1 and the n-type column regions NC1 are periodically arranged in the cell region CR.

The gate pull-out unit GPU is arranged over the epitaxial layer ERS via the gate insulating film GOX. The channel region CH is also arranged under the gate pull-out unit GPU. Then, the interlayer insulating film IL is arranged so as to cover an upper surface and sidewalls on the both sides of the gate pull-out unit GPU and an opening through which part of the upper surface of the gate pull-out unit GPU is to be exposed is formed in part of the interlayer insulating film IL. In addition, as the gate pull-out unit GPU, for example, the polycrystalline silicon film and so forth may be used similarly to the gate electrode GE.

Then, the gate pull-out electrode GPE is arranged over the interlayer insulating film IL including the inside of the opening. As the gate pull-out electrode GPE, the laminated film which includes the barrier conductor film configured by, for example, the titanium tungsten film so forth and the main conductor film the barrier conductor film and is configured by, for example, the aluminum film similarly to the source electrode SE may be used.

Here, the gate pull-out unit GPU is electrically coupled with the plurality of gate electrodes GE and a gate voltage which has been applied to the gate pull-out electrode GPE is applied to each of the plurality of gate electrodes GE via the gate pull-out unit GPU.

The channel region CH which extends from the cell region CR is formed over the upper part of the epitaxial layer EPS. The source pull-out region SPR is arranged so as to be contained in the channel region CH. The source pull-out region SPR is configured by the semiconductor region into which the n-type impurity such as, for example, phosphorous (P), arsenic (As) or the like has been introduced similarly to the source region SR.

The interlayer insulating film IL is arranged over an upper surface of the epitaxial layer EPS so as to cover the channel region CH and an opening through which the source pull-out region SPR is to be exposed is formed in the interlayer insulating film IL.

Then, the source pull-out electrode SPE is arranged over the interlayer insulating film IL including the inside of the opening. As the source pull-out electrode SPE, the laminated film which includes the barrier conductor film configured by, for example, the titanium tungsten film and the main conductor film which is laminated on the barrier conductor film and configured by, for example, the aluminum film and so forth may be used similarly to the source electrode SE.

Also in the intermediate region TR, the surface protective film PAS which is configured, for example, by the silicon oxide film and so forth is arranged so as to partially cover the gate pull-out electrode GPE and the source pull-out electrode SPE and a partial region of the gate pull-out electrode GPE and a partial region of the source pull-out electrode SPE are exposed from the surface protective film PAS.

(3) Structure of Peripheral Region PER

A field plate electrode (also called an electrode, a dummy electrode and so forth) FFP is formed in the peripheral region PER as illustrated in FIG. 2.

The field plate electrode FFP is arranged over the epitaxial layer EPS formed over the semiconductor substrate IS.

Also in the peripheral region PER, p-type column regions PC3 and n-type column regions NC3 are periodically arranged. As illustrated in FIG. 3, an outer peripheral region of the rectangular region (corresponding to the cell region CR and the intermediate region TR) that the linear p-type column regions PC1 and the linear n-type column regions NC1 are alternately arranged and the p-type column regions PC2 and the n-type column regions NC2 are also alternately arranged servers as the peripheral region PER. Then, the linear p-type column regions PC3 and the linear n-type column regions NC3 which extend in the Y direction are alternately arranged along the sides (the right and left sides in FIG. 3) which extend in the Y direction of the peripheral region PER. In addition, the linear p-type column regions PC3 and the linear n-type column regions PC3 which extend in the X direction are alternately arranged along the sides (the upper and lower sides in FIG. 3) which extend in the X direction of the intermediate region TR.

In addition, the p-type column region PC3 and the n-type column region NC3 (the epitaxial layer EPS) in the peripheral region PER are designed to respectively have the same widths as the p-type column regions PC1 and PC2 and the n-type column regions NC2 and NC3 in the cell region CR and the intermediate region TR.

The field plate electrode FFP is formed over the p-type column region PC3 and the n-type column region NC3 (the epitaxial layer EPS) so configured in the peripheral region PER (see FIG. 2). As the field plate electrode FFP, for example, the polycrystalline silicon film and so forth may be used similarly to the gate electrode GE. The field plate electrode FFP is covered with the interlayer insulating film IL. The surface protective film PAS configured by, for example, the silicon oxide film and so forth is arranged over the interlayer insulating film IL. It is possible to alleviate electric-field concentration and to improve the breakdown voltage by providing the field plate electrode FFP in this way.

The field plate electrode FFP is arranged over, for example, a boundary between the p-type column region PC3 and the n-type column region NC3 and is linearly arranged similarly to the p-type column region PC3 and the n-type column region NC3.

It is possible to reduce on-resistance while ensuring a high breakdown voltage by arranging the power MOSFET over the principal surface of the structural body (the super junction structure) that the p-type column regions (PC1) and n-type column regions (NC1) as mentioned above are alternately arranged.

For example, if the power MOSFET has been arranged over the principal surface of the n-type epitaxial layer without adopting the super junction structure, it would be necessary to ensure the breakdown voltage by reducing the impurity concentration of the epitaxial layer and extending a depletion layer to be formed in the epitaxial layer.

Accordingly, in order to attain the high breakdown voltage, it would be necessary to thicken the epitaxial layer which is low in impurity concentration. On the other hand, if the epitaxial layer which is low in impurity concentration is thickened, the on-resistance of the power MOSFET will be increased. That is, in the power MOSFET, improvement of the breakdown voltage and a reduction in on-resistance are in a trade-off relationship.

In contrast, when the power MOSFET has been arranged over the principal surface of the structural body (the super junction structure) that the p-type column regions (PC1) and the n-type column regions (NC1) are alternately arranged, the depletion layer extends from a boundary region between the p-type column region (PC1) and the n-type column region (NC1), that is, a p-n junction which extends in a longitudinal direction (a Z-direction) in a lateral direction. Therefore, even when the impurity concentration of the n-type column region NC1 which serves as a current path is increased in order to reduce the on-resistance in the power MOSFET having the super junction structure, the depletion layer extends in the lateral direction from the p-n junction which extends in the longitudinal direction (the Z direction) and therefore it is possible to ensure the breakdown voltage.

It is possible to reduce the on-resistance while ensuring the high breakdown voltage by adopting the structure that the p-type column regions (PC1) and the n-type column regions (NC1) are alternately arranged.

Since the depletion layer is extended so as to surround the cell region CR by periodically arranging the p-type column regions (PC2, PC3) and the n-type column regions (NC2, NC1), it is possible to more improve the breakdown voltage not only in the cell region CR but also in the intermediate region TR and the peripheral region PER.

(4) Depth of p-Type Column Region (PC1, PC2, PC3) in each Region

Here, in the present embodiment, a counter-doped region CD is provided under the structural body (the super junction structure) that the p-type column regions (PC1) and the n-type column regions (NC1) are periodically arranged in the cell region CR. Therefore, the effect of the p-type impurity is cancelled out under the p-type column region PC1 in the cell region CR and the effective p-type impurity concentration is reduced. Accordingly, in the cell region CR, the depth of the p-type column region (PC1) is made shallow. In other words, the depth (the dimension in the Z direction, $T_{CR}$) of the p-type column region PC1 in the cell region is made shallower (more shallowed, that is, $T_{CR}<T_{TR}$) than the depth (the dimension in the Z direction, $T_{TR}$) of the p-type column region PC2 in the intermediate region TR. Incidentally, the depth (the dimension in the Z direction, $T_{PER}$) of the p-type column region PC3 in the peripheral region PER is almost the same as the depth (the dimension in the Z direction, $T_{TR}$) of the p-type column region PC2 in the intermediate region TR. In addition, the depth (the dimension in the Z direction) of the n-type column region NC1 in the cell region, the depth (the dimension in the Z direction) of the n-type column region NC2 in the intermediate region TR and the depth (the dimension in the Z direction) of the n-type column region NC3 in the peripheral region PER are almost the same as one another.

Here, the depth of the p-type column region means the depth of a p-type impurity region. The p-type impurity region means a region in which the concentration of the p-type impurity is, for example, at least about $1.0 \times 10^{15}/cm^3$ ($1E15/cm^3$). In addition, a start point from which the depth of the p-type column region is measured is, for example, the front surface of the structural body (the epitaxial layer EPS) that the p-type column regions and the n-type column regions are periodically arranged.

It is possible to improve an avalanche resistance by making the depth ($T_{CR}$) of the p-type column region PC1 in the cell region CR shallower than the depth ($T_{TR}$) of the p-type column region PC2 in the intermediate region TR ($T_{CR}<T_{TR}$) in this way.

The avalanche resistance indicates an allowed current amount of an avalanche current which flows until breakage occurs caused by an avalanche breakdown phenomenon. A voltage which is in excess of a power supply voltage is applied to the semiconductor device and the avalanche breakdown phenomenon occurs in the semiconductor device when the voltage exceeds an avalanche breakdown voltage. In this occasion, the current which flows to the semiconductor device is called the avalanche current and the semiconductor device is broken when the avalanche current exceeds the avalanche resistance (the allowed current amount) of the power semiconductor element.

When the avalanche current has flown as in the above mentioned case and moreover current concentration of the avalanche currents has occurred, the avalanche current which leads to occurrence of breakage is reduced and consequently the avalanche resistance is reduced.

In contrast, in the present embodiment, it is possible to alleviate (avoid) the local current concentration of the avalanche currents and thereby it is possible to improve the avalanche resistance by making the depth ($T_{CR}$) of the p-type column region PC1 in the cell region CR shallower than the depth ($T_{TR}$) of the p-type column region PC2 in the intermediate region TR ($T_{CR}<T_{TR}$). The improvement of the avalanche resistance will be described in detail later.

Incidentally, members to be formed in the cell region CR, the intermediate region TR and the peripheral region PER are not limited to the above-mentioned members and other members may be arranged. For example, guard rings and so forth may be provided in addition to the p-type column regions PC3 in the peripheral region PER.

[Description on Manufacturing Method]

Next, a manufacturing method for the semiconductor device according to the present embodiment will be described and the configuration of the semiconductor device according to the present embodiment will be more clarified with reference to FIG. 4 to FIG. 21. FIG. 4 to FIG. 21 are sectional diagrams and plan views each illustrating one example of a manufacturing process of the semiconductor device according to the present embodiment. The semiconductor device according to the present embodiment is manufactured by using, for example, a so-called "trench fill method".

Figure 4:
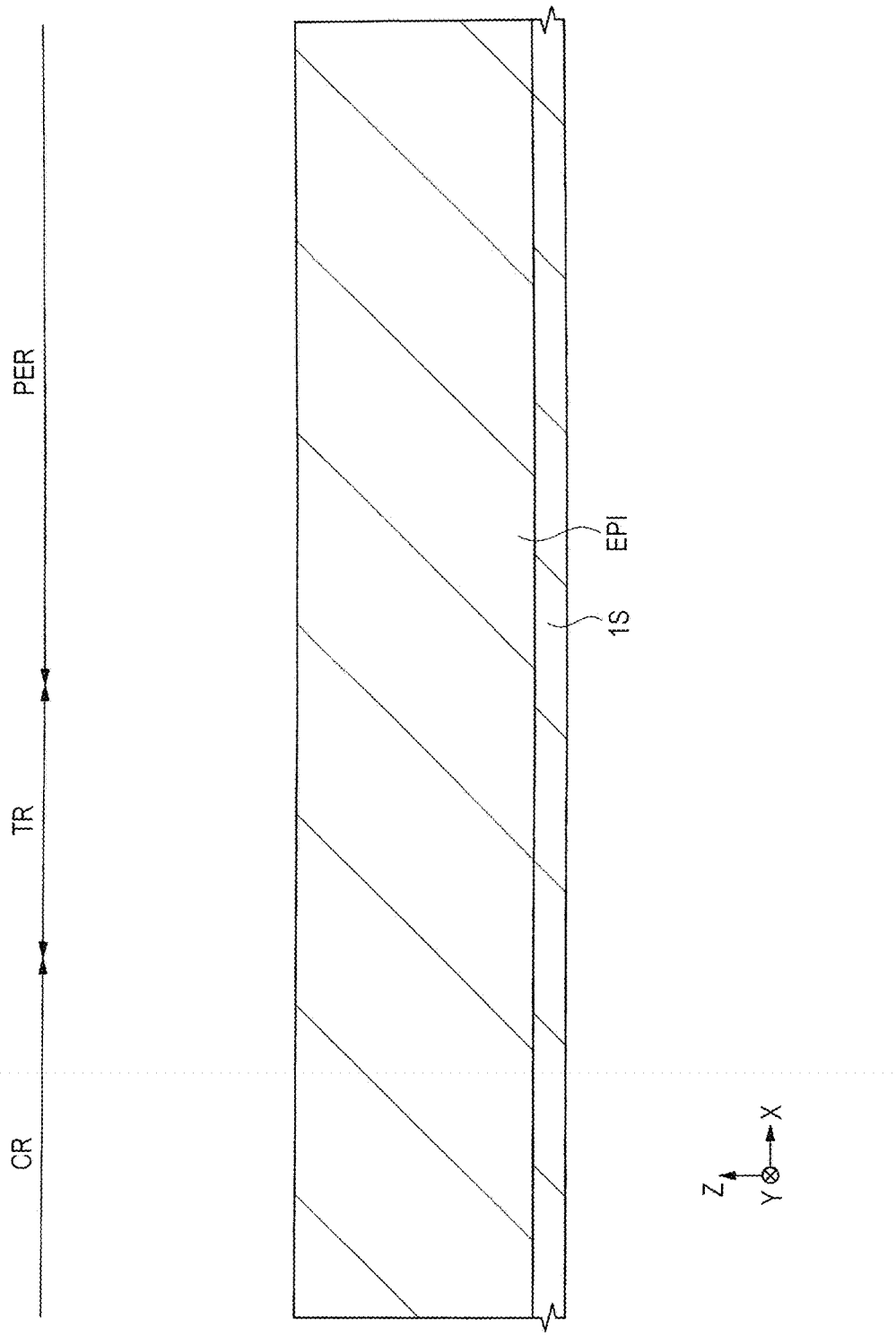
FIG. 4 is a sectional diagram illustrating one example of a manufacturing process of the semiconductor device according to the first embodiment.

First, as illustrated in FIG. 4, the semiconductor substrate IS that an epitaxial layer EP1 which is configured by an n-type semiconductor layer has been formed over the principal surface (the front surface, the upper surface) is prepared. The semiconductor substrate IS is formed by introducing the n-type impurity such as, for example, phosphorus (P), arsenic (As) or the like into a single crystal silicon. In addition, the n-type impurity concentration of the epitaxial layer EP1 is, for example, about $3.4\times10^{15}/cm^3$ and the thickness of the epitaxial layer EP1 is, for example, about 40 μm to about 60 μm.

Figure 5:
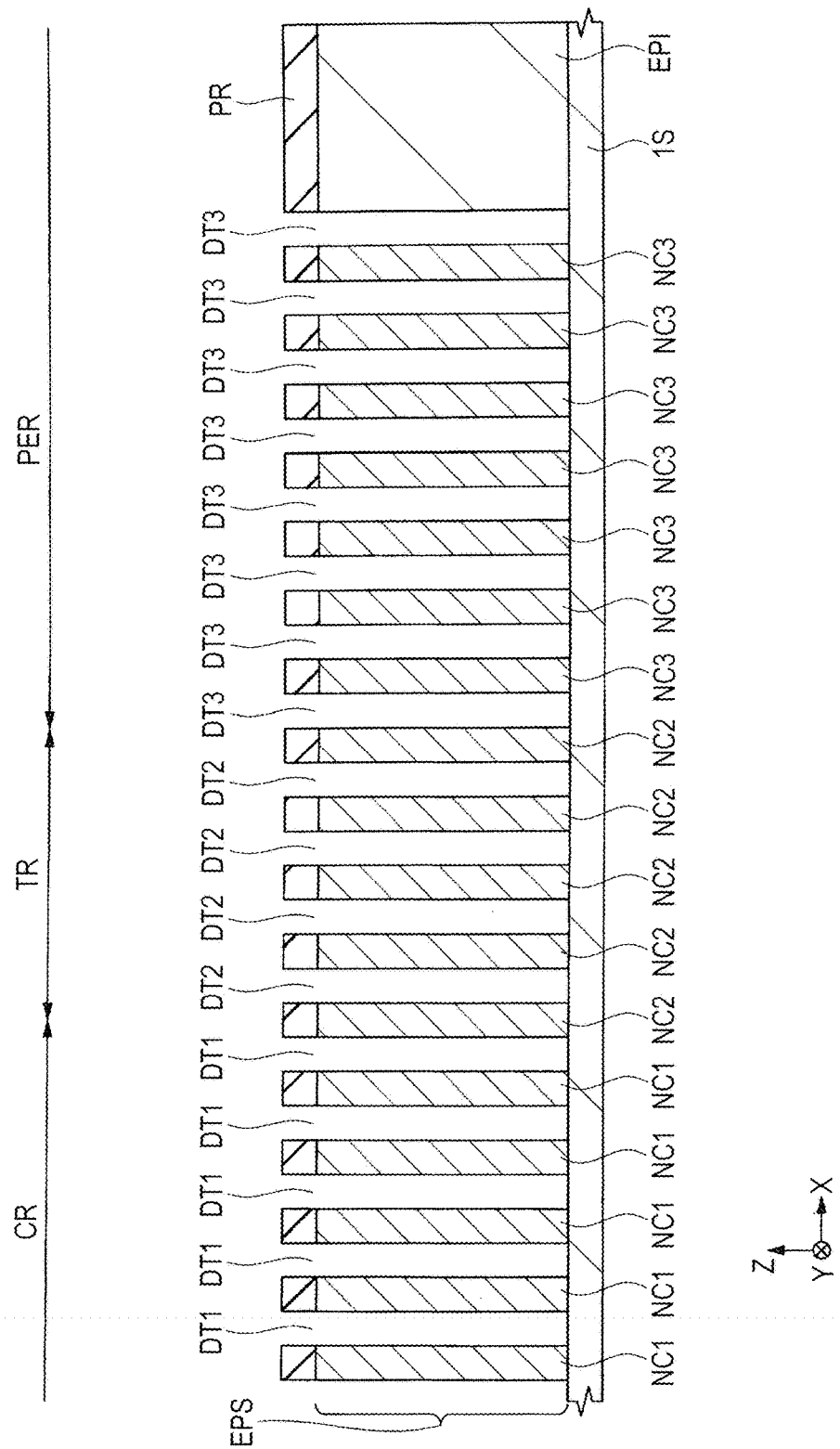
FIG. 5 is a sectional diagram illustrating one example of the manufacturing process of the semiconductor device according to the first embodiment, that is, the sectional diagram illustrating the manufacturing process following the sectional diagram in FIG. 4.

Then, as illustrated in FIG. 5, a photoresist film PR is formed over the epitaxial layer EP1 and is exposed and developed. Thereby, the photoresist film PR is formed in each n-type column region (NC1, NC3) formation region (a region in which the n-type column region will be formed) over the epitaxial layer EP1. In other words, the epitaxial layer EP1 of the p-type column region (PC1, PC3) formation region is exposed. Incidentally, although exposure (transcription of a reticle pattern) of the cell region CR (including the intermediate region TR) and the peripheral region PER may be performed at one time, exposure may be individually performed region by region.

Figure 6:
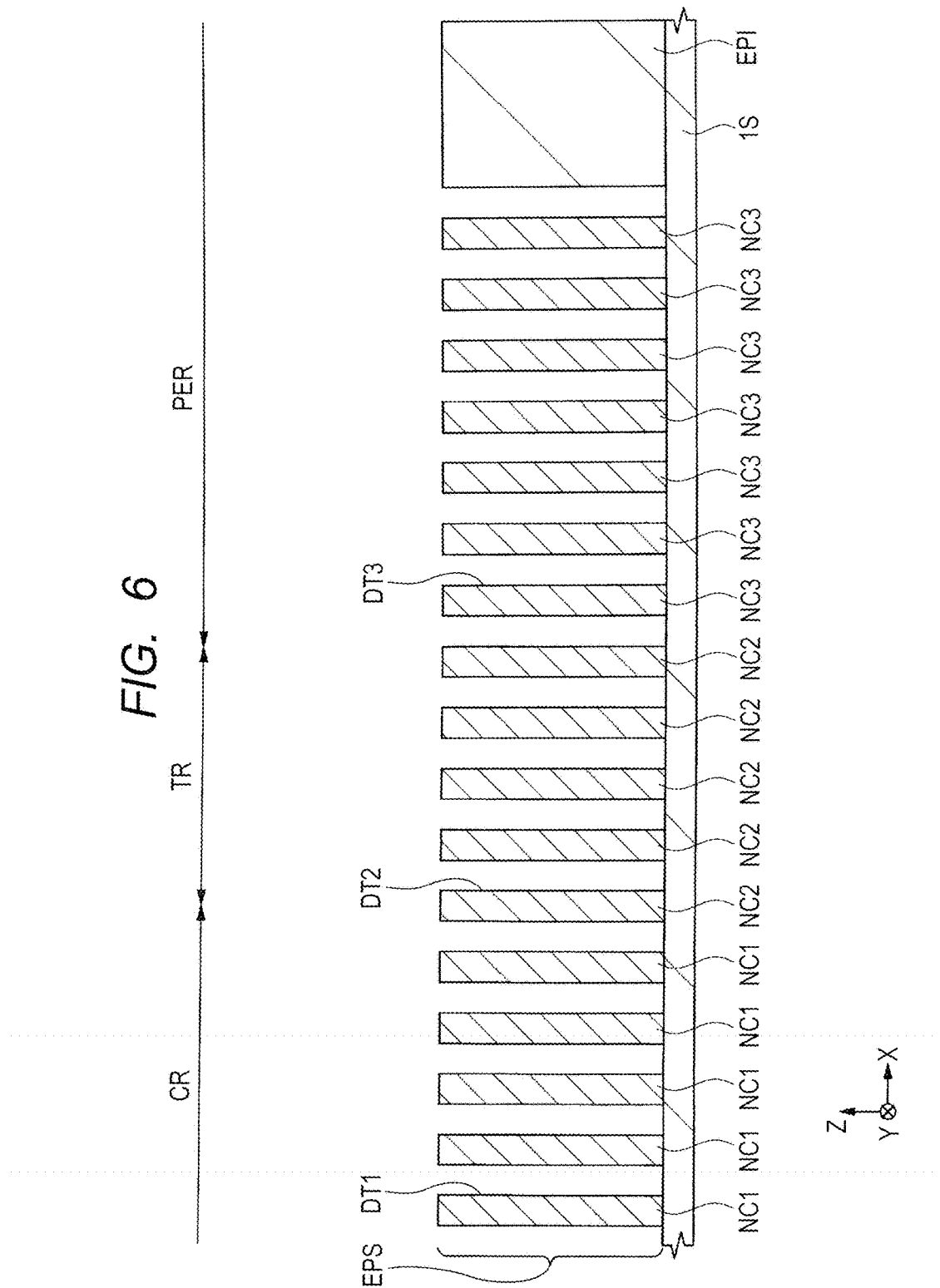
FIG. 6 is a sectional diagram illustrating one example of the manufacturing process of the semiconductor device according to the first embodiment, that is, the sectional diagram illustrating the manufacturing process following the sectional diagram in FIG. 5.

Then, the epitaxial layer EP1 is etched off by using the photoresist film PR as a mask. Thereby, the epitaxial layer EP1 of the p-type column region (PC1, PC2, PC3) formation region is removed and a ditch (also called a trench) (DT1, DT2, DT3) is formed. Then, as illustrated in FIG. 6, the photoresist film PR is removed by, for example, asking and so forth. To process a lower-layer film into a desirable shape by performing etching by using the photoresist film which has been processed to a desirable shape by exposure and development in this way, a hard mask film or the like as the mask is called patterning.

Figure 7:
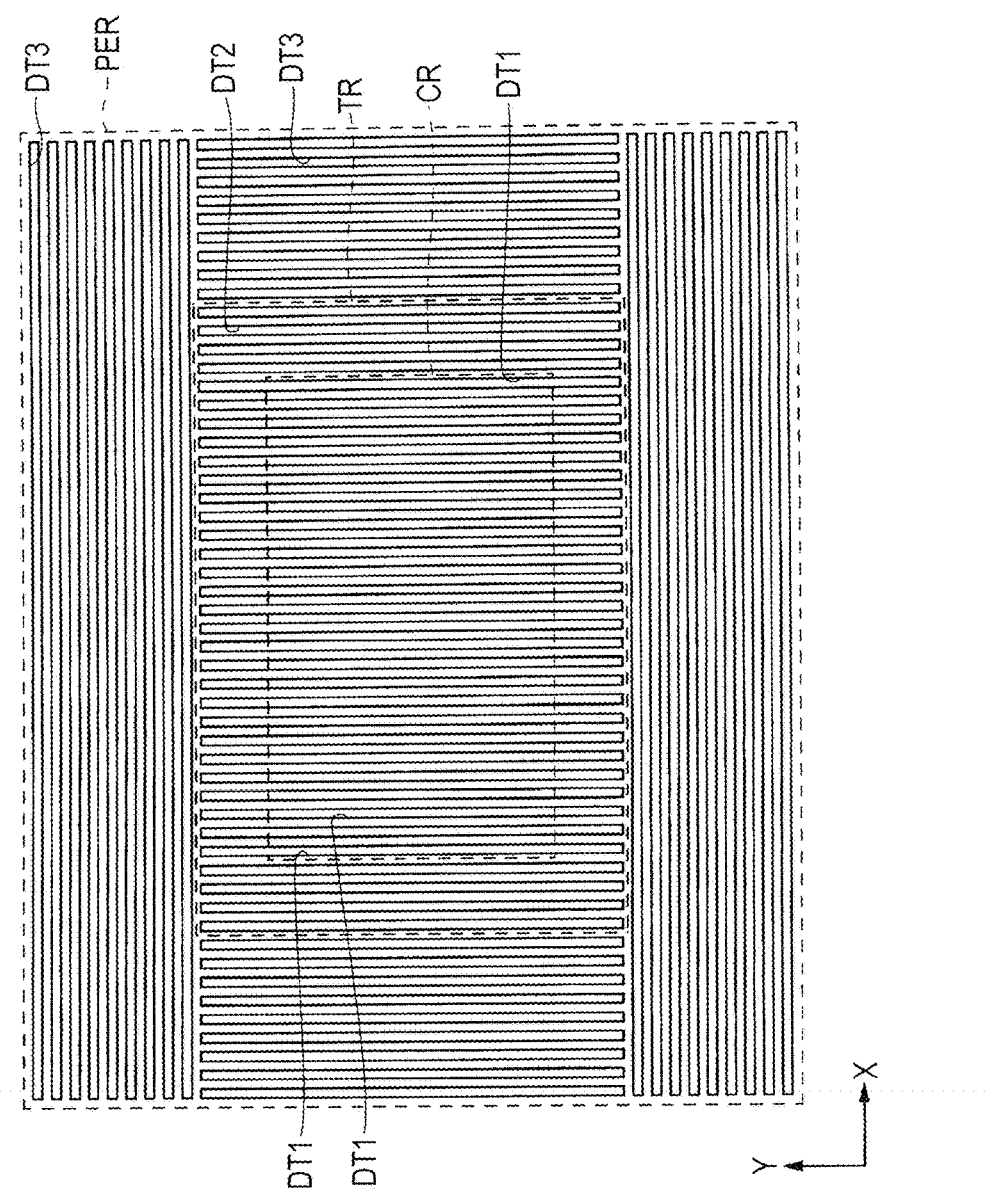
FIG. 7 is a plan view illustrating one example of the manufacturing process of the semiconductor device according to the first embodiment.

Here, as illustrated in FIG. 6 and FIG. 7, the ditch formed in the epitaxial layer EP1 in the cell region CR is designated by DT1, the ditch formed in the epitaxial layer EP1 in the intermediate region TR is designated by DT2 and the ditch formed in the epitaxial layer EP1 in the peripheral region PER is designated by DT3. The ditches DT1 and DT2 are in the form of lines extending in the Y direction and the ditch DT3 is in the form of a line extending in the Y or X direction (see FIG. 7).

For example, the width (the dimension in the X or Y direction) and the depth (the dimension in the XZ direction) of each of the ditches DT1, DT2 and DT3 are, for example, about 2 μm to about 5 μm and about 40 μm to about 60 μm, respectively. Then, parts of the epitaxial layer EP1 which are left not removed between the adjacent ditches DT1, DT2 and DT3 serve as the linear n-type column regions NC1, NC2 and NC3. The width (the dimension in the X direction) of the n-type column region (NC1, NC2, NC3) is, for example, about 2 μm to about 5 μm. In addition, the depth (the dimension in the Z direction) of the n-type column region (NC1, NC2, NC3) is, for example, about 40 μm to about 60 μm.

Figure 8:
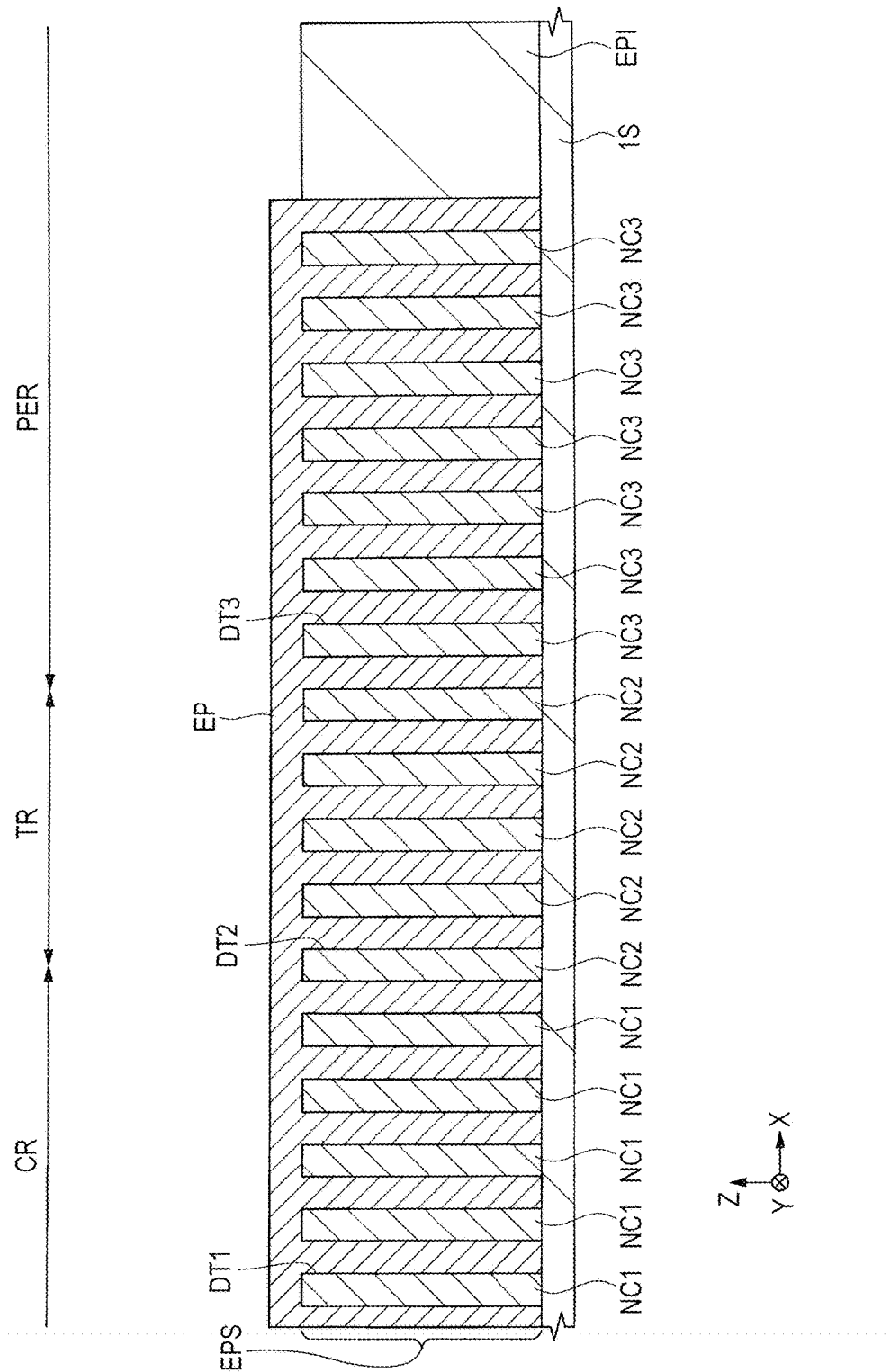
FIG. 8 is a sectional diagram illustrating one example of the manufacturing process of the semiconductor device according to the first embodiment, that is, the sectional diagram illustrating the manufacturing process following the sectional diagram in FIG. 6.

Then, as illustrated in FIG. 8, the p-type epitaxial layer EP is formed within the ditches DT1, DT2 and DT3 and over the epitaxial layer EP1 by, for example, an embedded epitaxial growing method and so forth. That is, the epitaxial layer EP is made to grow while introducing the p-type impurity. In this occasion, the epitaxial layer EP grows from the bottom and the sidewalls (the side faces) of each of the ditches DT1, DT2 and DT3 and the inner part of each of the ditches DT1, DT2 and DT3 is embedded with the epitaxial layer EP. In addition, the epitaxial layer EP also grows on the epitaxial layer EP1 located between the ditches and on upper parts of the ditches DT1, DT2 and DT3 which have been embedded with the epitaxial layer EP. The p-type impurity concentration of the p-type epitaxial layer EP is, for example, about $3.0\times10^{15}/cm^3$.

Figure 9:
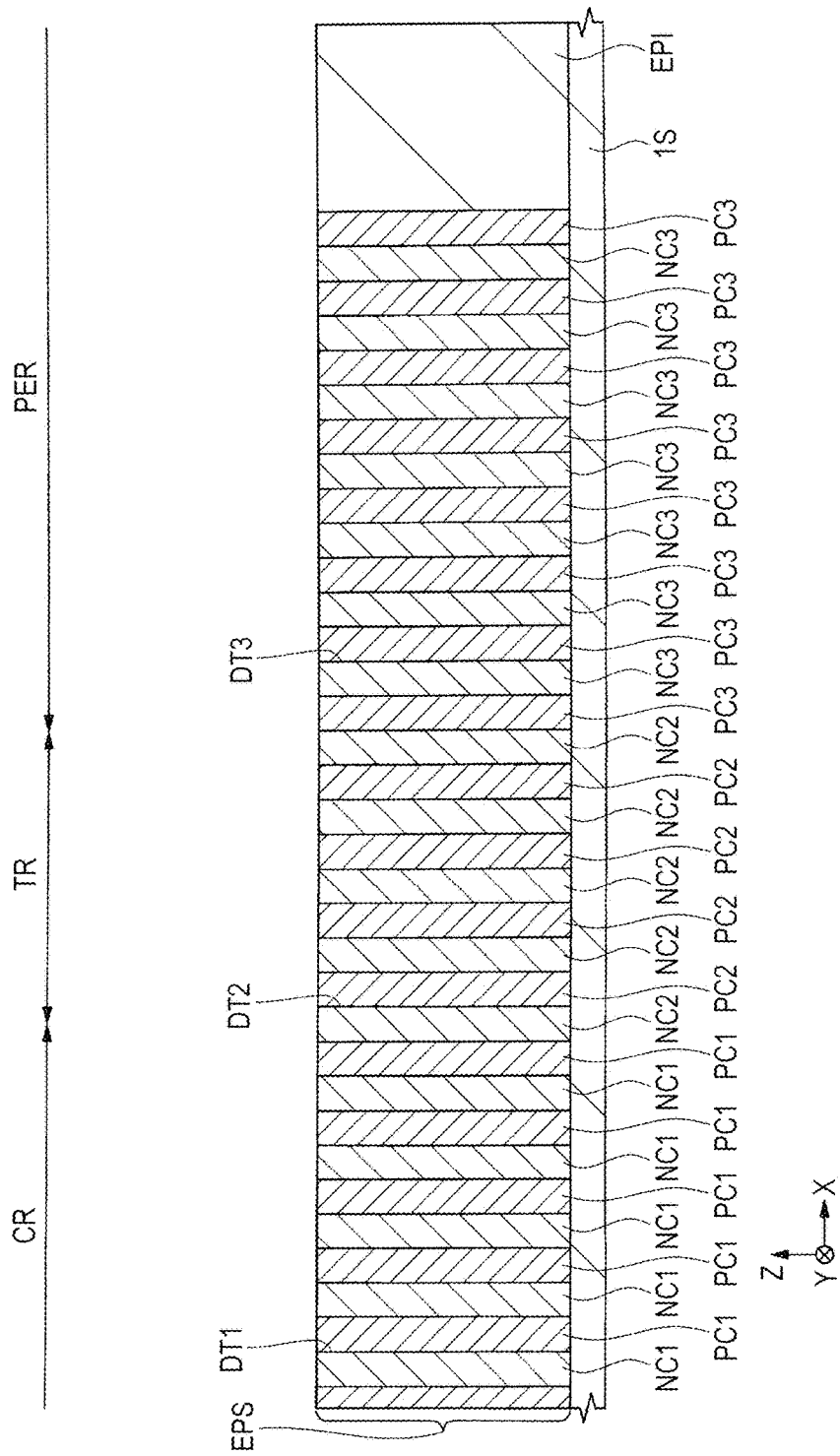
FIG. 9 is a sectional diagram illustrating one example of the manufacturing process of the semiconductor device according to the first embodiment, that is, the sectional diagram illustrating the manufacturing process following the sectional diagram in FIG. 8.

Then, as illustrated in FIG. 9, the epitaxial layer EP is embedded in the ditches DT1, DT2 and DT3 by removing the epitaxial layer EP formed over the upper parts of the diches DT1, DT2 and DT3 by using, for example, a CMP (Chemical Mechanical Polishing) method and so forth. Thereby, the linear p-type column regions PC1, PC2 and PC3 are formed. In other words, an epitaxial layer EPS configured by the pluralities of p-type column regions PC1, PC2 and PC3 and the pluralities of n-type column regions NC1, NC2 and NC3.

Figure 10:
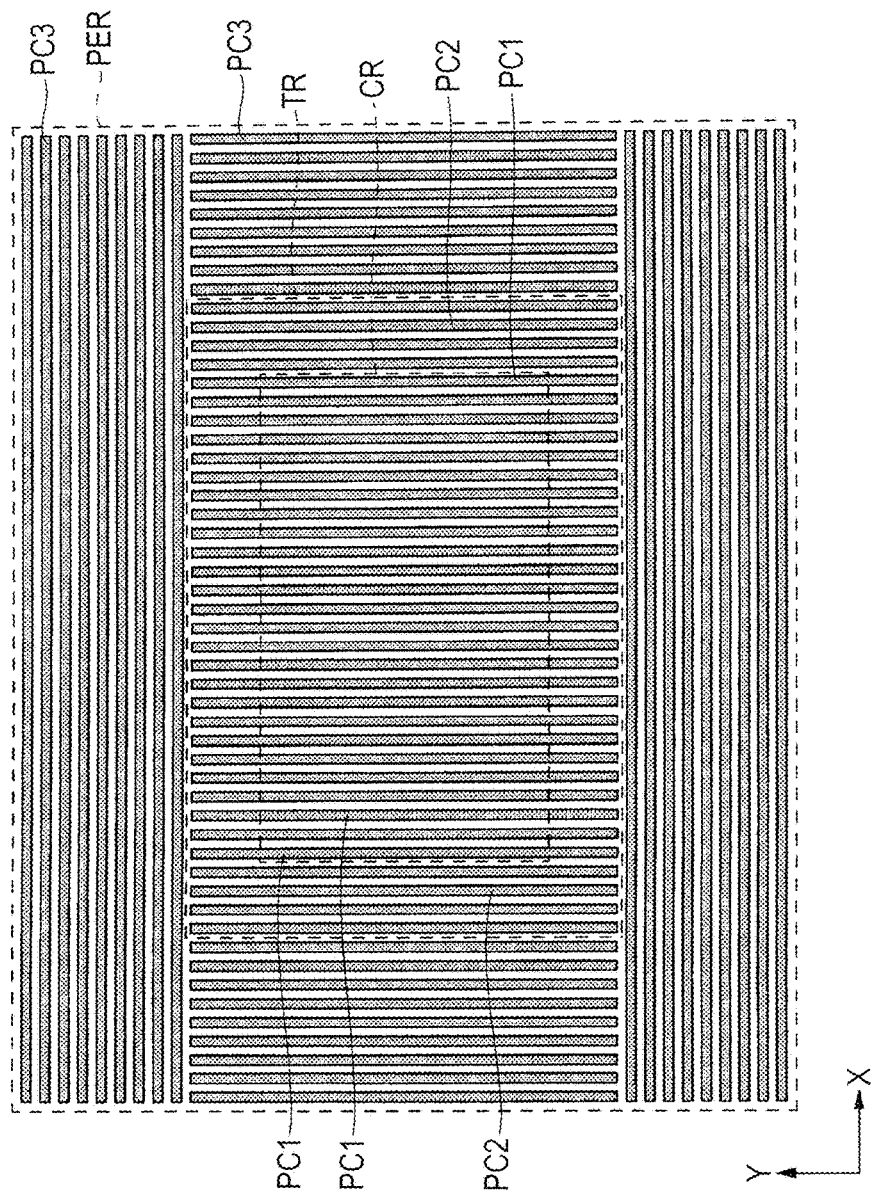
FIG. 10 is a plan view illustrating one example of the manufacturing process of the semiconductor device according to the first embodiment.

In the cell region CR and the intermediate region TR, a structural body that the linear p-type column regions (PC1, PC2) which extend in the Y direction and the linear n-type column regions (NC1, NC2) which extend in the Y direction are periodically arranged alternately in the X direction is formed by performing the above-mentioned steps. In addition, in the peripheral region PER, structural bodies in each of which the linear p-type column regions PC3 which extend in the Y direction and the linear n-type column regions NC3 which extend in the Y direction are periodically arranged alternately in the X direction are formed on the upper and lower sides of the cell and intermediate regions and structural bodies in each of which the linear p-type column regions PC3 which extend in the X direction and the linear n-type column regions NC 3 which extend in the X direction are periodically arranged alternately in the Y direction are formed on the right and left sides of the cell and intermediate regions (FIG. 10).

Then, the power MOSFET, the gate pull-out unit GPU, the gate pull-out electrode GPE, the source pull-out region SPR, the source pull-out electrode PPE, the field plate electrode FFP and so forth are formed over the principal surface of the epitaxial layer EPS.

Figure 11:
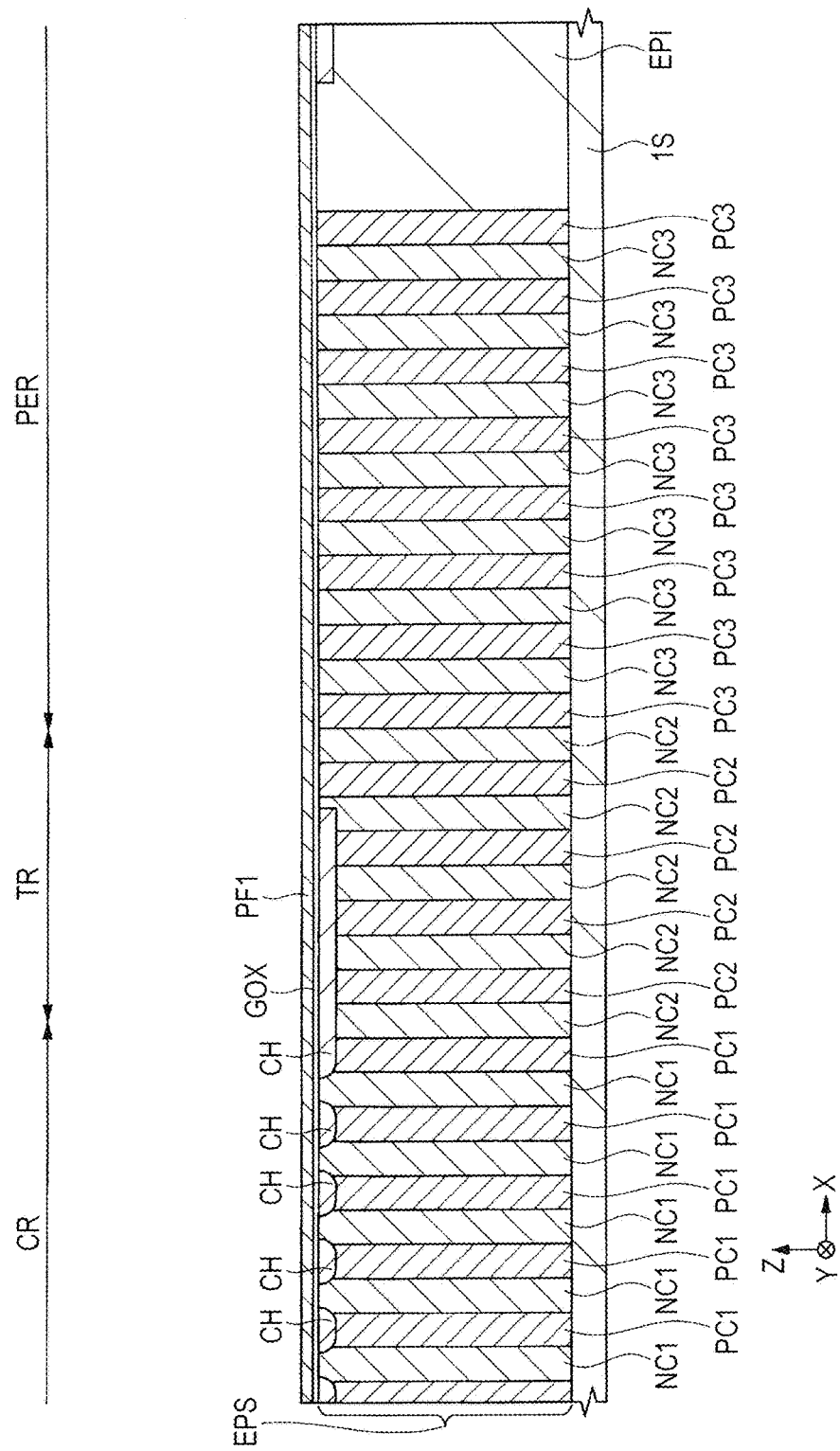
FIG. 11 is a sectional diagram illustrating one example of the manufacturing process of the semiconductor device according to the first embodiment, that is, the sectional diagram illustrating the manufacturing process following the sectional diagram in FIG. 9.

For example, the channel region CH is formed as illustrated in FIG. 11. A mask film having an opening in a channel region CH formation region is formed by using, for example, a photolithographic technology, an etching technology and so forth. Then, the channel region CH is formed by implanting impurity ions by using the mask film as a mask. As the impurity ions, ions of the p-type impurity such as, for example, boron (B) and so forth are implanted. Thereby, it is possible to form a p-type semiconductor region which serves as the channel region CH.

Then, the mask film is removed, the gate insulating film GOX is formed over the epitaxial layer EPS and a conductor film PF1 is formed over the gate insulating film GOX. A silicon oxide film is formed as the gate insulating film GOX by, for example, thermally oxidizing the front surface of the epitaxial layer EPS. Then, the polycrystalline silicon film is deposited over the silicon oxide film by using, for example, a CVD method and so forth. As the gate insulating film GOX, a high-permittivity film which is higher in permittivity than the silicon oxide film, such as, for example, a hafnium oxide film and so forth may be used in place of the silicon oxide film. In addition, the gate insulating film GOX may be formed by, for example, the CVD method and so forth.

Figure 12:
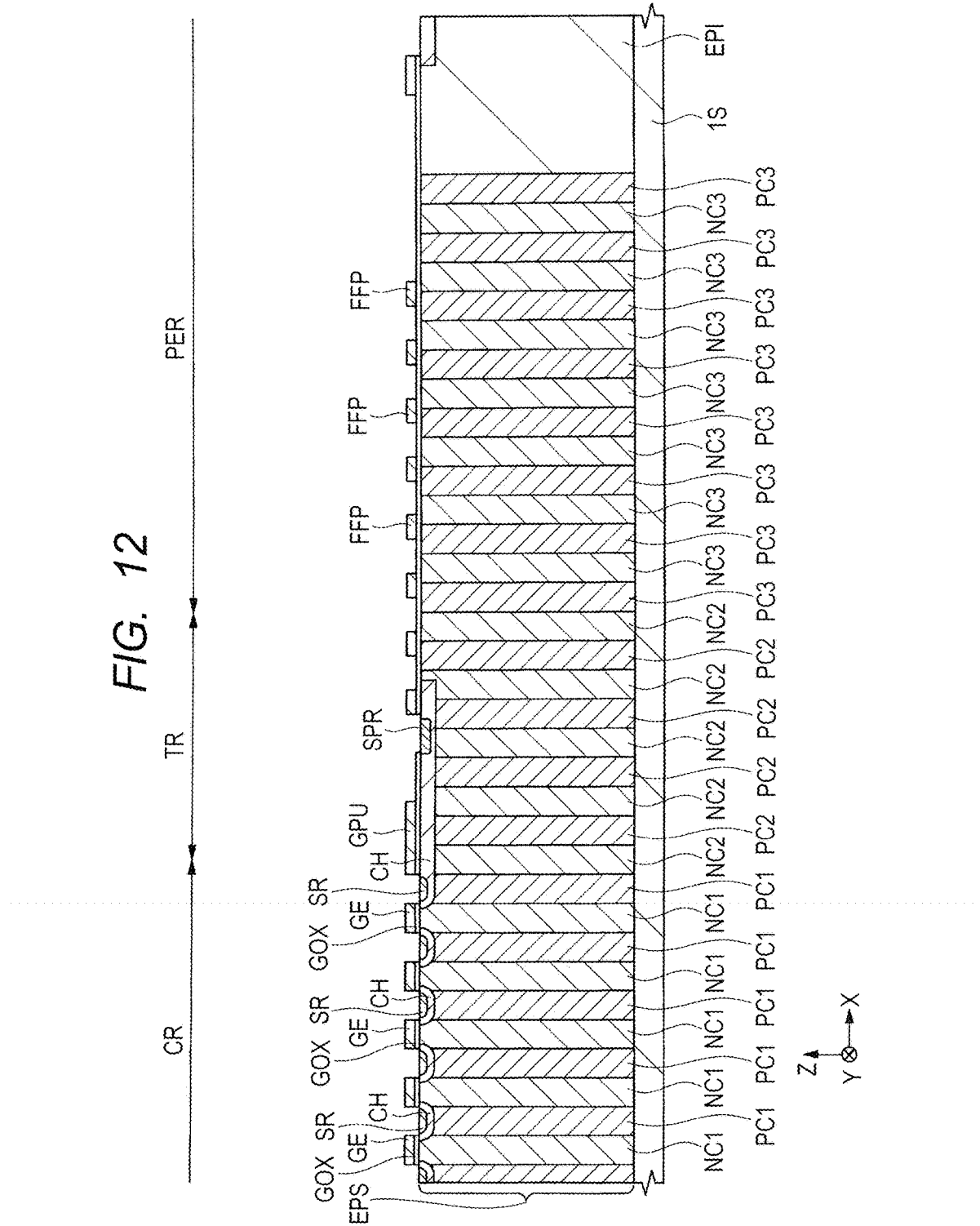
FIG. 12 is a sectional diagram illustrating one example of the manufacturing process of the semiconductor device according to the first embodiment, that is, the sectional diagram illustrating the manufacturing process following the sectional diagram in FIG. 11.
Figure 13:
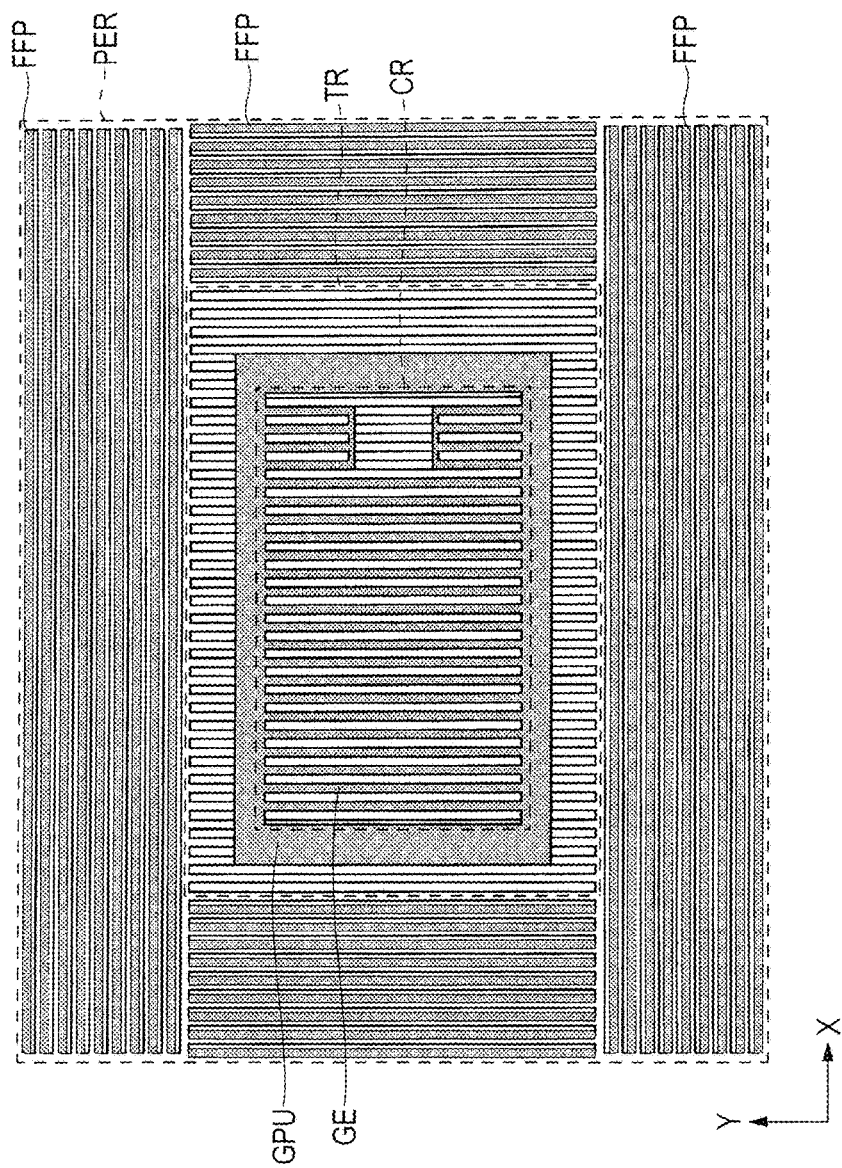
FIG. 13 is a plan view illustrating one example of the manufacturing process of the semiconductor device according to the first embodiment.

Then, as illustrated in FIG. 12, the gate electrode GE is formed over the n-type column region NC1. In addition, the gate pull-out unit GPU is formed in the intermediate region TR. Further, the field plate electrode FFP is formed over the p-n junction between the p-type column region PC3 and the n-type column region NC3. For example, the photoresist film which covers each gate electrode GE formation region, each gate pull-out unit GPU formation region and each field plate electrode FFP formation region is formed over the conductor film PF1 and the conductor film PF1 is etched off by using the photoresist film as the mask. Thereby, the gate electrode GE, the gate pull-out unit GPU and the field plate electrode FFP are formed. For example, as illustrated in FIG. 13, the gate electrode GE is linearly formed similarly to the n-type column region PC1 and the gate pull-out unit GPU is formed so as to be electrically coupled with the plurality of gate electrodes GE. In addition, the field plate electrode FFP is linearly formed similarly to the p-type column region PC3.

Figure 14:
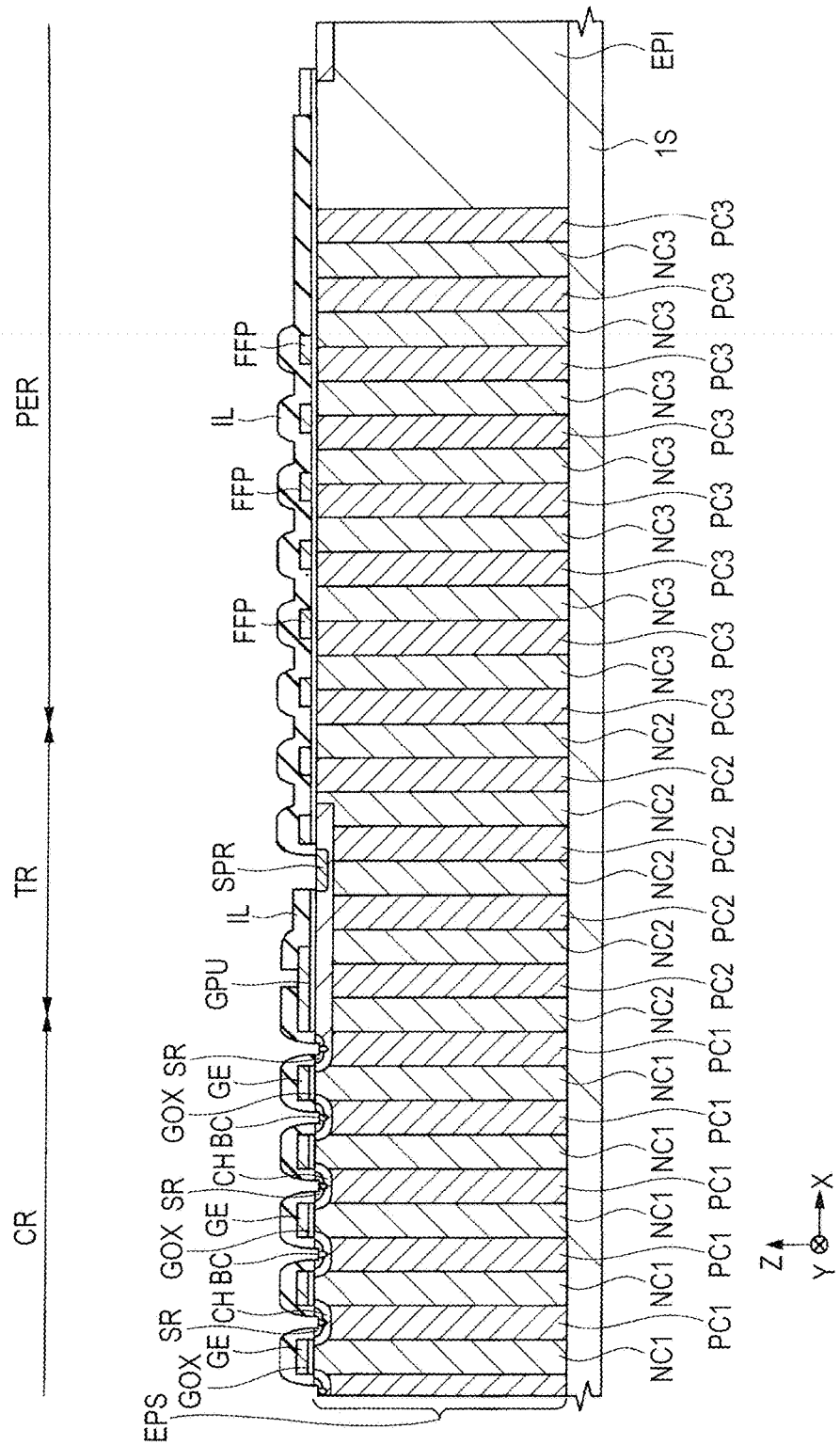
FIG. 14 is a sectional diagram illustrating one example of the manufacturing process of the semiconductor device according to the first embodiment, that is, the sectional diagram illustrating the manufacturing process following the sectional diagram in FIG. 12.

Then, as illustrated in FIG. 14, the source region SR and the source pull-out region SPR are formed. For example, regions other than a region that the source-pull-out region SPR is to be formed in the peripheral region PER and the intermediate region TR are covered with the photoresist film (not illustrated) and n-type impurity ions are implanted by using the photoresist film and the gate electrode GE in the cell region CR as the masks. For example, as the impurity ions, the ions of the n-type impurity such as, for example, phosphorous (P), arsenic (As) and so forth are implanted. Thereby, it is possible to form one n-type semiconductor region which will serve as the source region SR between the gate electrodes GE in the cell region. In addition, it is possible to form another n-type semiconductor region which will serve as the source pull-out region SPR in the intermediate region TR. The plurality of source region SR which have been formed in the cell region CR are electrically coupled with the source pull-out region SPR formed in the intermediate region TR.

Then, the interlayer insulating film IL for covering the gate electrode GE, the gate pull-out unit GPU and the field plate electrode FFP is formed. The silicon oxide film is deposited over the gate electrode GE and so forth by, for example, the CVD method and so forth. Then, a photoresist film (not illustrated) having openings on a body contact region BC formation region, on the gate pull-out unit GPU and on the source pull-out region SPR is formed over the interlayer insulating film IL. Then, the interlayer insulating film IL formed over the source region SR which is located between the adjacent gate electrodes GE in the cell region CR is etched off by using the photoresist film as the mask and thereby the openings are formed. In this occasion, over-etching is performed such that the bottom of each opening is located lower than the front surface of the epitaxial layer EPS. Thereby, the source region SR is exposed from the sidewall of the bottom of each opening. In addition, the openings are formed by etching off the interlayer insulating film IL formed over the gate pull-out unit GPU and the source pull-out region SPR in the intermediate region TR.

Then, the photoresist film which covers the intermediate region TR and the peripheral region PER is formed and impurity ions are implanted by using the photoresist film and the interlayer insulating film IL as the masks and thereby the body contact region BC is formed. As the impurity ions, ions of the p-type impurity, such as, for example, boron (B) and so forth are implanted. Thereby, it is possible to form a p-type semiconductor region which serves as the body contact region BC. The body contact region BC is located on a central part of the source region SR and the bottom of the body contact region BC reaches the channel region CH. Incidentally, the impurity concentration of the body contact region BC is higher than the impurity concentration of the channel region CH.

Figure 15:
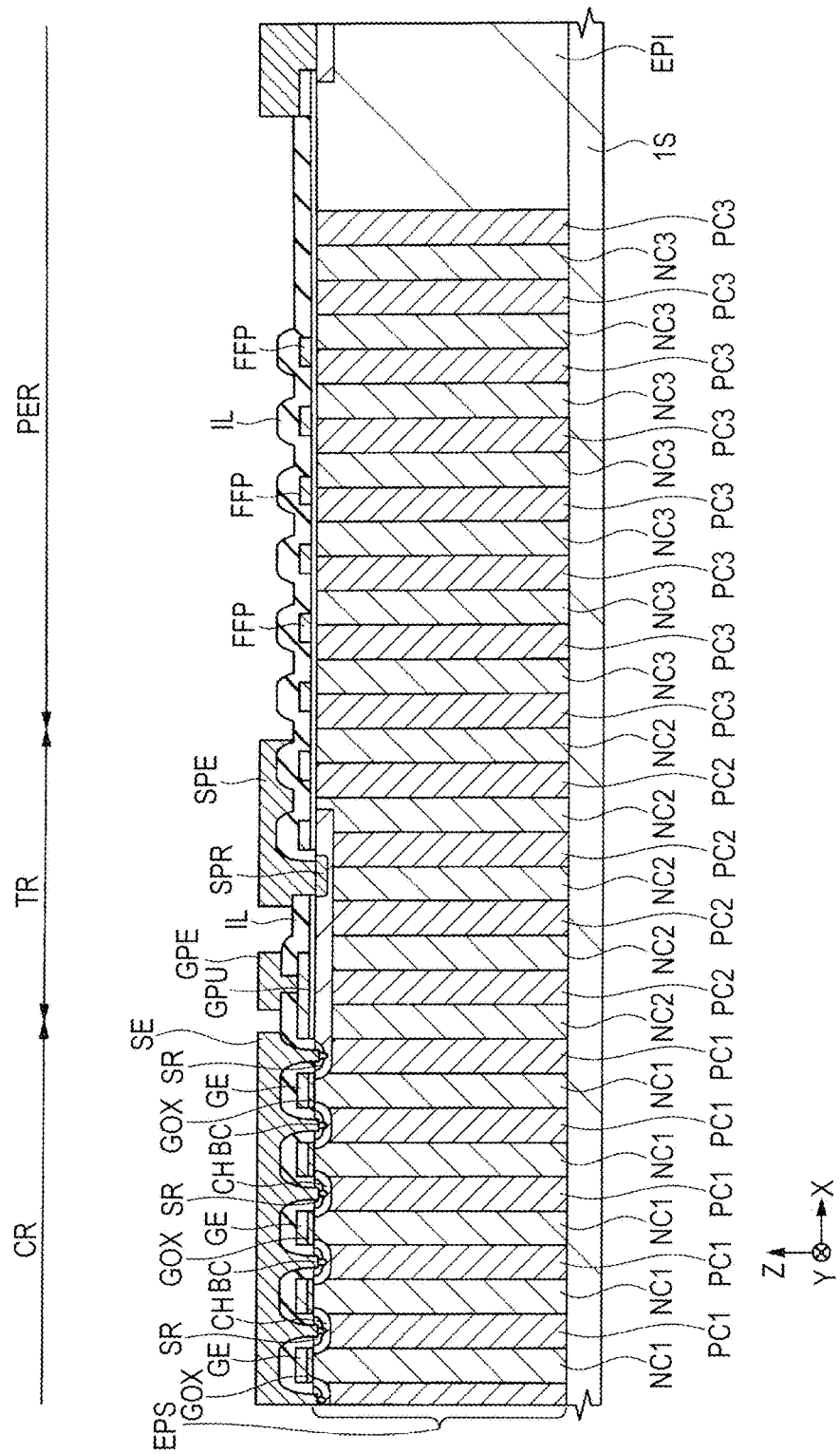
FIG. 15 is a sectional diagram illustrating one example of the manufacturing process of the semiconductor device according to the first embodiment, that is, the sectional diagram illustrating the manufacturing process following the sectional diagram in FIG. 14.
Figure 16:
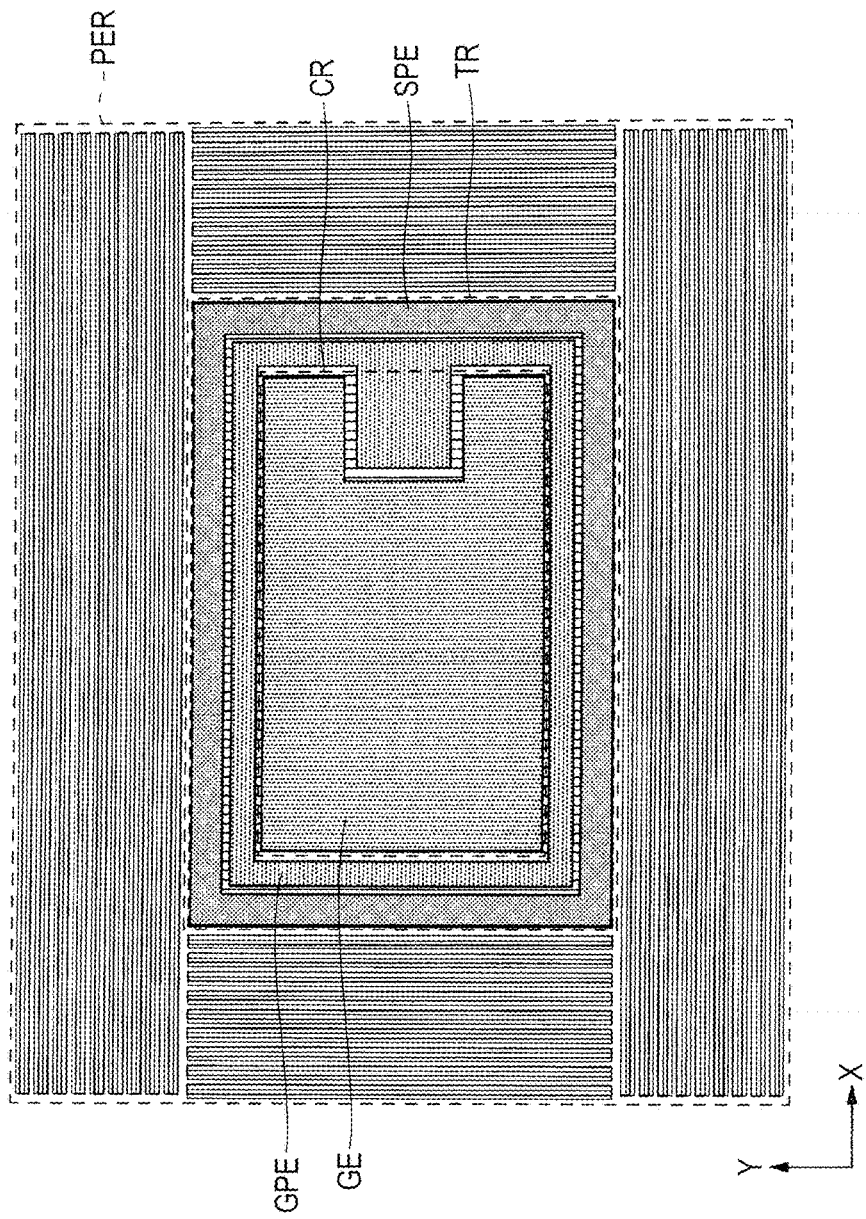
FIG. 16 is a plan view illustrating one example of the manufacturing process of the semiconductor device according to the first embodiment.

Then, as illustrated in FIG. 15 and FIG. 16, the source electrode SE, the gate pull-out electrode GPE and the source pull-out electrode SPE are formed. A metal film is formed over, for example, the body contact region BC, the gate pull-out unit GPU and the source pull-out region SPR and also over the interlayer insulating film IL. The laminated film which includes, for example, the titanium tungsten film and the aluminum film laminated on the titanium tungsten film by, for example, a sputtering method and so forth. Then, the metal film is patterned to form the source electrode SE, the gate pull-out electrode GPE and the source pull-out electrode SPE. The source electrode SE in the cell region CR is electrically coupled with the source region SR and the body contact region BC. The gate pull-out electrode GPE in the intermediate region TR is electrically coupled with the gate pull-out unit GPU. In addition, the source pull-out electrode SPE in the intermediate region TR is electrically coupled with the source pull-out region SPR.

Figure 17:
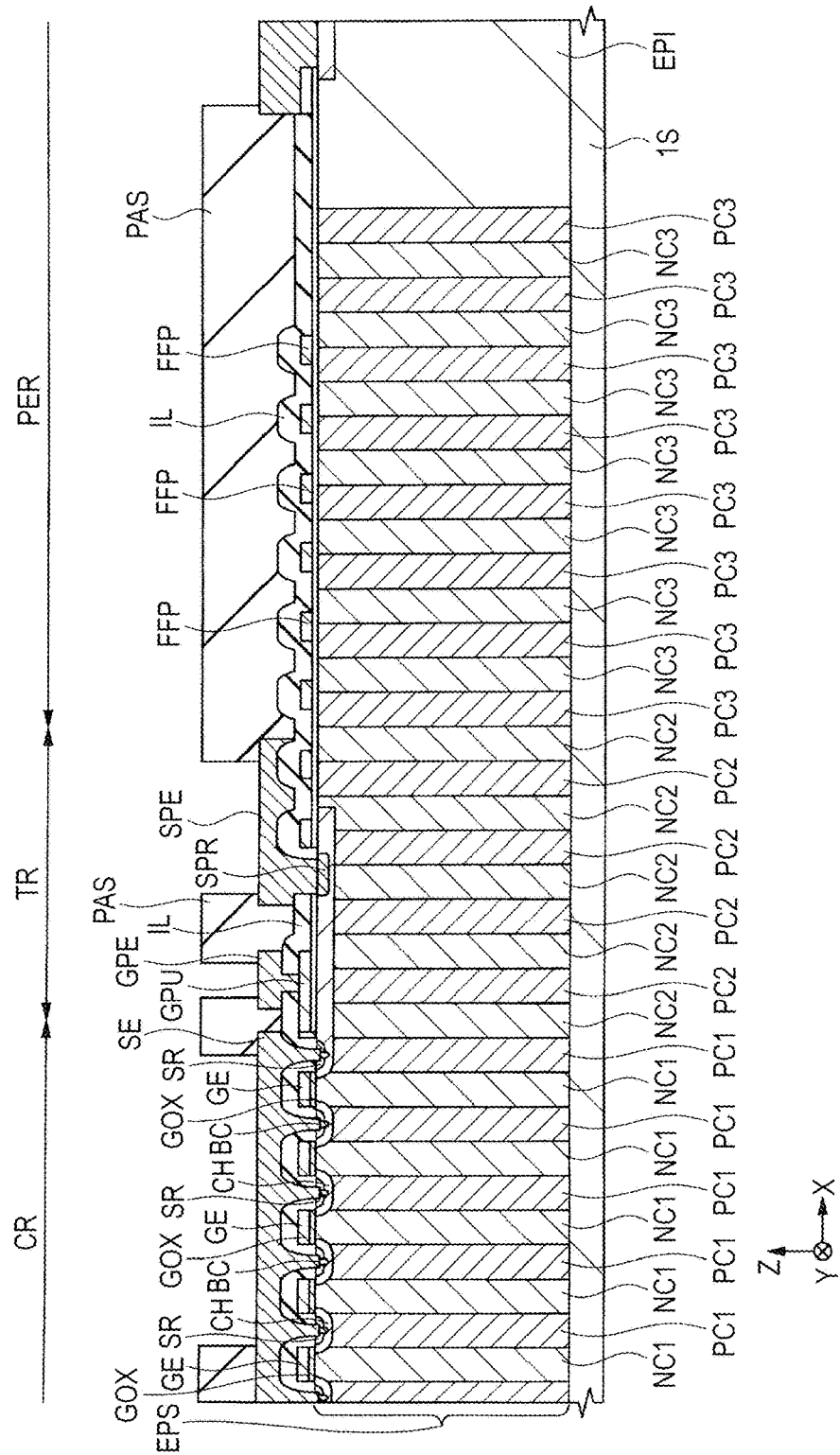
FIG. 17 is a sectional diagram illustrating one example of the manufacturing process of the semiconductor device according to the first embodiment, that is, the sectional diagram illustrating the manufacturing process following the sectional diagram in FIG. 15.

Then, as illustrated in FIG. 17, the surface protective film is formed so as to cover the source electrode SE, the gate pull-out electrode GPE and the source pull-out electrode SPE. The silicon oxide film is deposited over the source electrode SE, the gate pull-out electrode GPE, the source pull-out electrode SPE and so forth, for example, by the CVC method and so forth. Then, the surface protective film PAS is patterned to expose the partial region of the source electrode SE, the partial region of the gate pull-out electrode GPE and the partial region of the source pull-out electrode SPE. The parts (regions) so exposed serve as external coupling regions (for example, a gate pad, a source pad and so forth).

Figure 18:
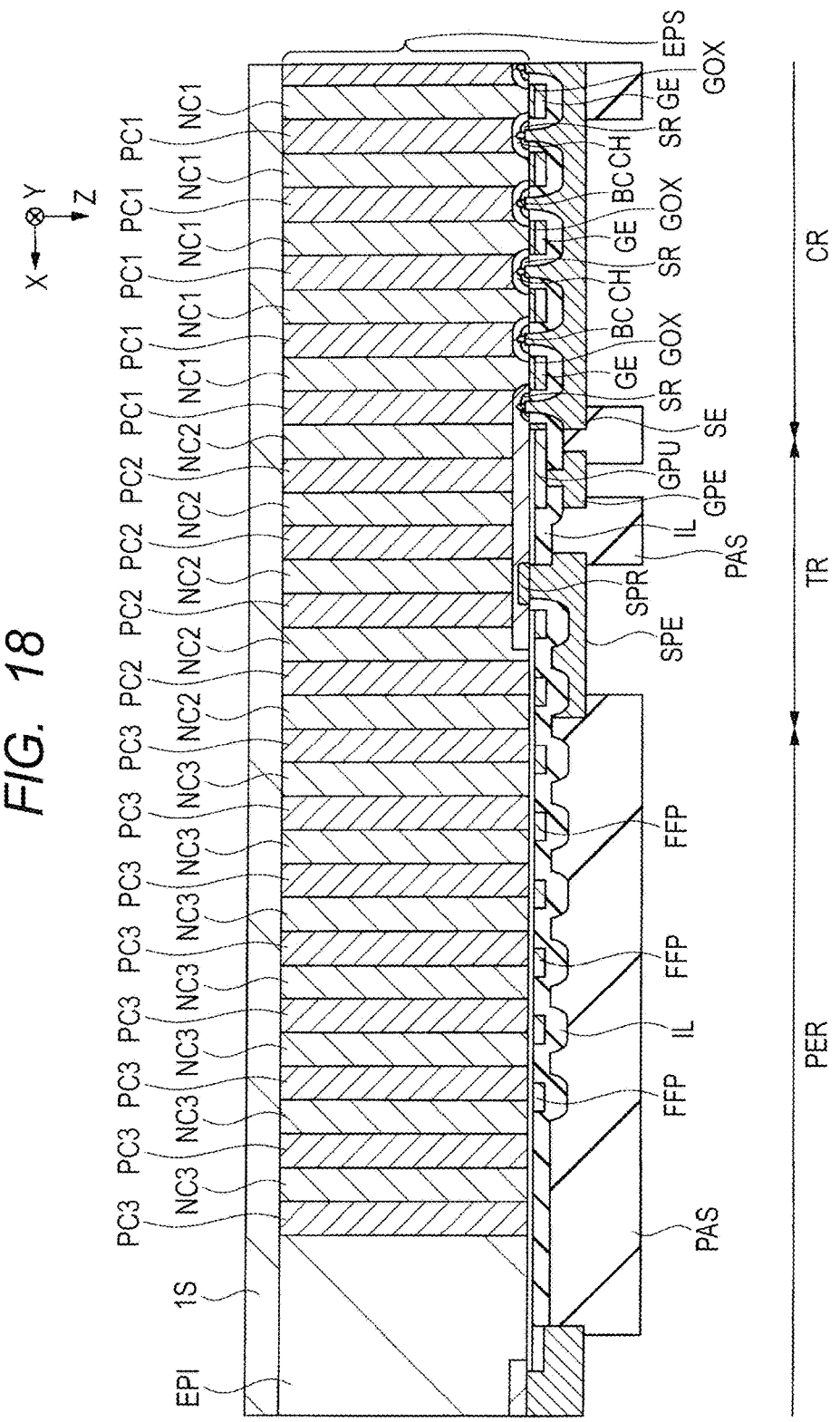
FIG. 18 is a sectional diagram illustrating one example of the manufacturing process of the semiconductor device according to the first embodiment, that is, the sectional diagram illustrating the manufacturing process following the sectional diagram in FIG. 17.

Then, as illustrated in FIG. 18, the back surface which is located on the opposite side (the ditch bottom side) of the principal surface of the semiconductor substrate 1S is turned upward as the upper surface and the back surface of semiconductor substrate 1S is ground. The back surface of the semiconductor substrate 1S is ground such that the thickness of the semiconductor substrate 1S and the thickness of the epitaxial layer EPS add up to, for example, about 50 μm to about 60 μm so as to thin the semiconductor substrate IS. By this grinding, the distance between the back surface of the semiconductor substrate 1S and the bottom of the ditch (DT1, TD2, DT3) is reduced to, for example, about 3 μm to about 5 μm.

Figure 19:
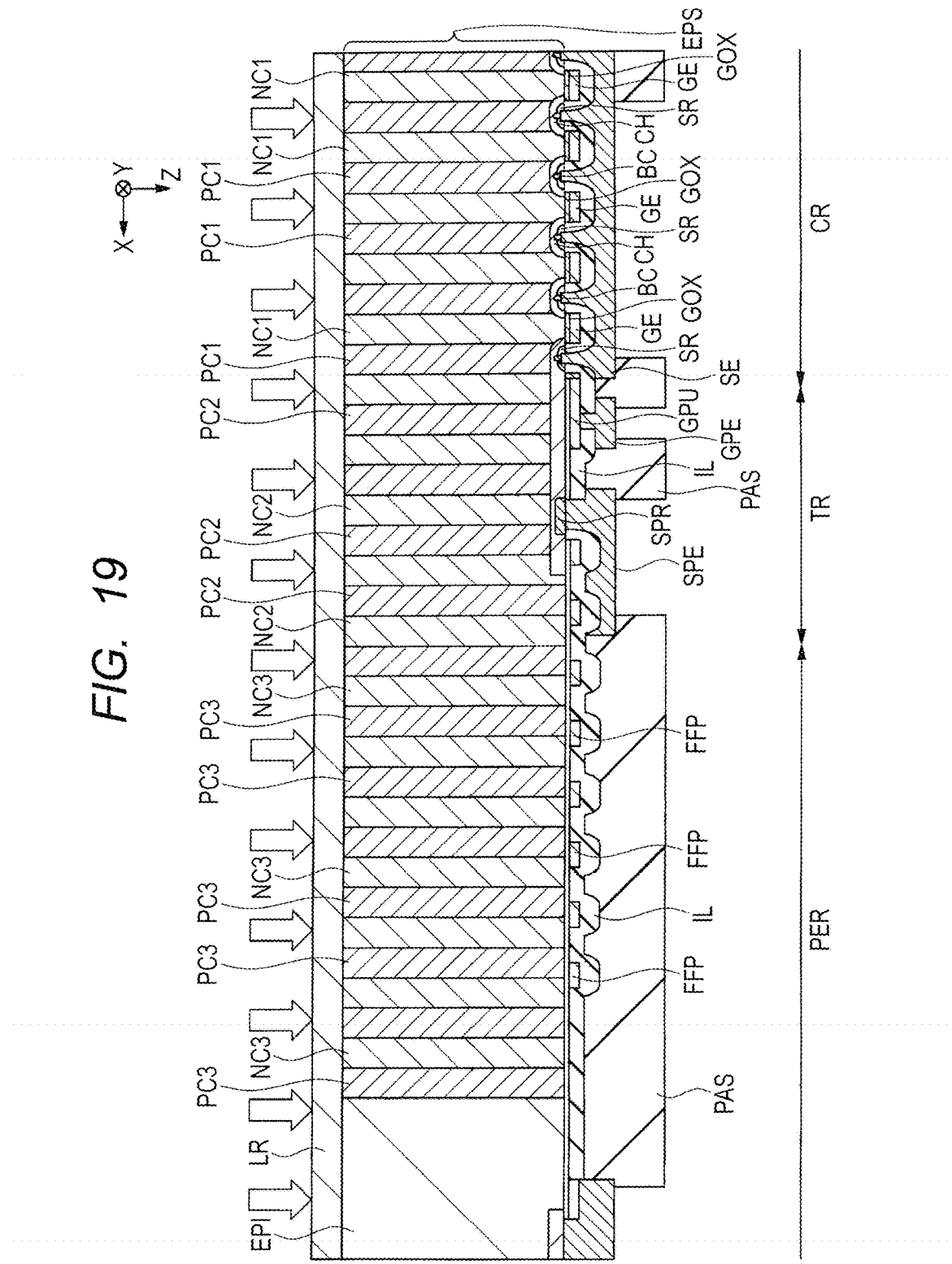
FIG. 19 is a sectional diagram illustrating one example of the manufacturing process of the semiconductor device according to the first embodiment, that is, the sectional diagram illustrating the manufacturing process following the sectional diagram in FIG. 18.

Then, as illustrated in FIG. 19, the n-type impurity ions are implanted into the entire of the back surface of the semiconductor substrate 1S and thereby an n-type semiconductor region (a low resistance region) LR is formed. It is possible to reduce contact resistance between a later described drain electrode DE and the n-type column region (NC1, NC2, NC3) by forming the n-type semiconductor region LR in this way. The n-type semiconductor region (the low resistance region) LR extends from the back surface of the semiconductor substrate 1S down to the bottom of the ditch (DT1, DT2, DT3). The concentration of the n-type impurity in the n-type semiconductor region LR is, for example, about $1.0 \times 10^{16}/cm^3$ and the thickness thereof is, for example, about 1 μm to about 2 μm.

Figure 20:
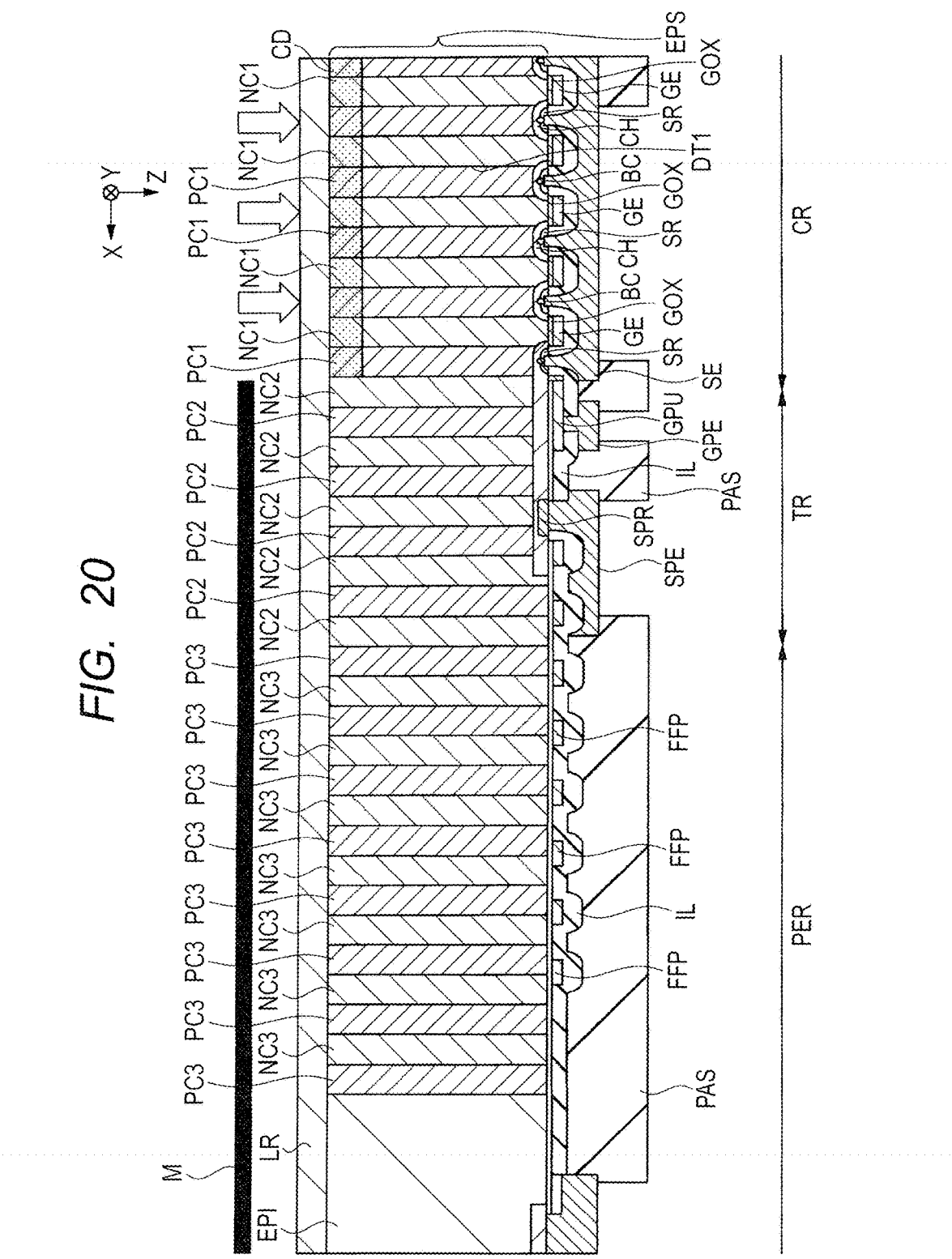
FIG. 20 is a sectional diagram illustrating one example of the manufacturing process of the semiconductor device according to the first embodiment, that is, the sectional diagram illustrating the manufacturing process following the sectional diagram in FIG. 19.

Then, as illustrated in FIG. 20, the n-type impurity ions are implanted (back surface selective implantation) into the cell region CR via a screening mask (also called a screen) M arranged over the intermediate region TR and the peripheral region PER and thereby the counter doped region CD is formed. In other words, the n-type impurity ions are implanted into the lower part of the p-type epitaxial layer (the p-type column region PC1) in the ditch DT1. The screening mask M is arranged over the semiconductor substrate 1S, leaving a space between the screening mask M and the semiconductor substrate 1S. In other words, the screening mask M is arranged between an ion generation source of an ion implantation device and the semiconductor substrate 1S. Then, the impurity ions in the n-type semiconductor region LR and the counter doped region CD are activated. The impurity ions are activated by, for example, laser annealing and so forth. Laser annealing is performed under such a condition that a range of about 2 μm in depth (thickness) is heated up to about 1000° C.

The counter doped region CD extends from the bottom of the ditch (DT1, DT2, DT3) toward the front surface of the semiconductor substrate 1S. The concentration of the n-type impurity to be implanted is, for example, about $1.0 \times 10^{16}/cm^3$ and the thickness thereof is, for example, about 2 μm. In addition, the n-type impurity is implanted into the structural body (the epitaxial layer EPS) that the p-type column regions PC1 and the n-type column regions NC1 are periodically arranged from the back surface side of the semiconductor substrate 1S. Therefore, on the back surface side of the semiconductor substrate 1S, the effect of the p-type impurity in the p-type column region PC1 is cancelled out by implantation of the n-type impurity and the effective p-type impurity concentration of the p-type column region PC1 is reduced. When the n-type impurity is implanted in dose of, for example, about $1.0 \times 10^{16}/cm^2$, the polarity of the p-type impurity which is, for example, about 3E15 to about 5E15/$cm^3$ is inverted. On the other hand, on the back surface side of the semiconductor substrate 1S, the amount of the n-type impurity in the n-type column region NC1 is increased by implantation of the n-type impurity. When the n-type impurity is implanted in dose of, for example, about $1.0 \times 10^{16}/$ $cm^2$, the n-type impurity concentration of the n-type column region NC1 is increased to, for example, about $1.0 \times 10^{22}/cm^3$ (1E22/$cm^3$).

In addition, on the back surface side of the semiconductor substrate 1S, the effect of the p-type impurity in the p-type column region PC1 is cancelled out by implantation of the n-type impurity. Consequently, it is possible to regard that the depth (the dimension in the Z direction) of the p-type column region PC1 has been reduced by the amount of the thickness of the counter doped region CD (see $T_{CR}$ in FIG. 2). Therefore, it is possible to regard that the depth (the dimension in the Z direction) of each of the p-type column regions PC1 which function as the super junction structure has been reduced by the amount of the thickness of the counter doped region CD (see $T_{CR}$ in FIG. 2). It is possible to reduce the depth (the dimension in the Z direction, $T_{CR}$) of the column region in the cell region CR by providing the counter doped region CD in this way.

Figure 21:
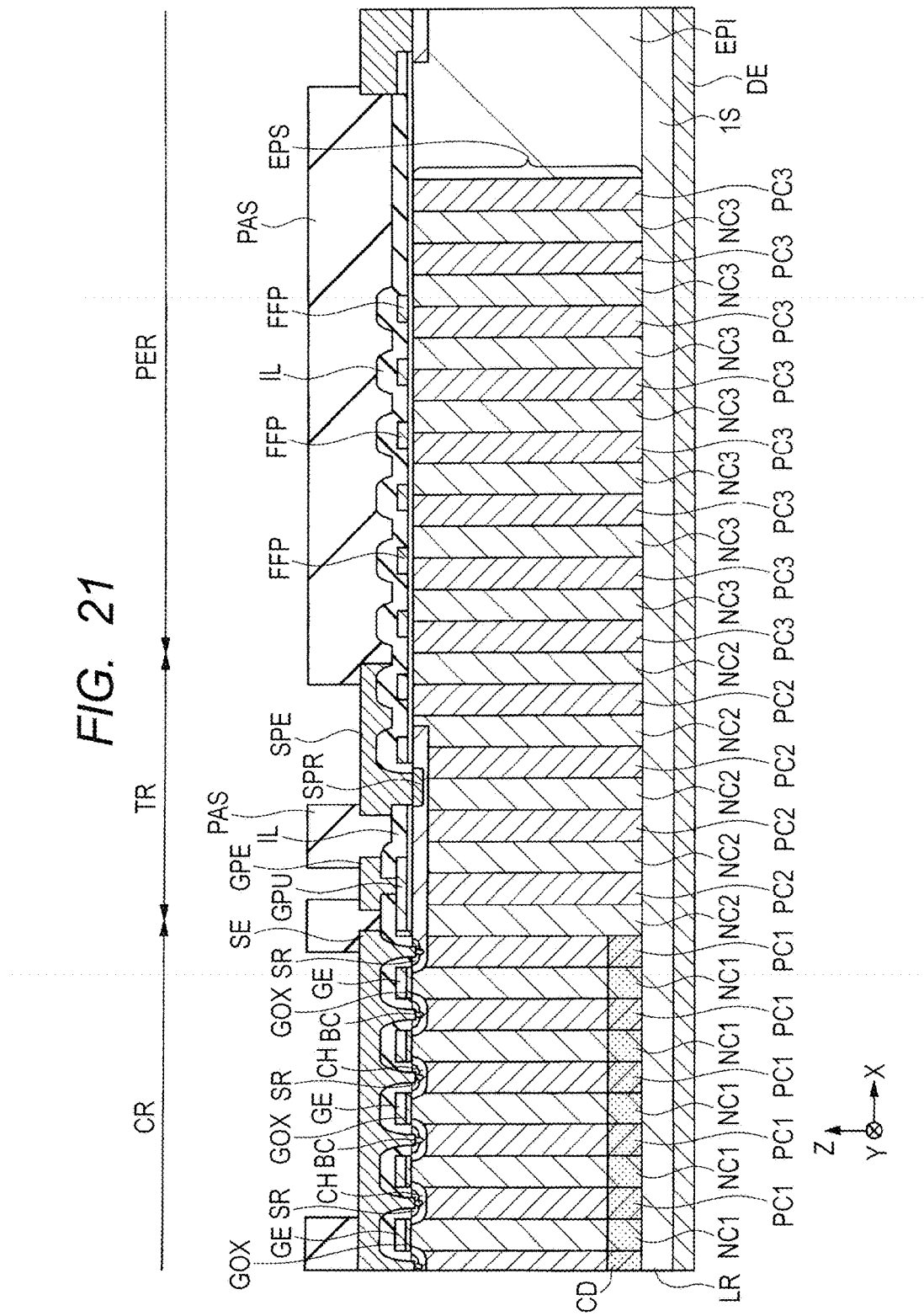
FIG. 21 is a sectional diagram illustrating one example of the manufacturing process of the semiconductor device according to the first embodiment, that is, the sectional diagram illustrating the manufacturing process following the sectional diagram in FIG. 20.

Then, as illustrated in FIG. 21, the drain electrode DE is formed over the back surface of the semiconductor substrate 1S. For example, the back surface side of the semiconductor substrate IS is tuned upward as the upper surface and the metal film is formed by, for example, the sputtering method, a vapor deposition method and so forth. Thereby, it is possible to form the drain electrode DE configured by the metal film.

By performing the above-mentioned process, it is possible to form the semiconductor device according to the present embodiment.

When the p-type column region (PC1, PC2, PC3) and the n-type column region (NC1, NC2, NC3) have been formed by using the trench fill method as in the present embodiment, it is possible to further reduce the space between the p-type column region and the n-type column region in comparison with the space obtained by using a "multi-epitaxial method". Thereby, it is possible to reduce the on-resistance and to improve the breakdown voltage. In addition, adoption of the "trench fill method" is more effective than adoption of the "multi-epitaxial method" also in throughput.

In addition, in the present embodiment, it is possible to reduce the depth (the dimension in the Z direction, $T_{CR}$) of the column region in the cell region CR owing to provision of the counter doped region CD. Specifically, it is possible to make the depth ($T_{CR}$) of the column region in the cell region CR shallower than the depth ($T_{TR}$) of the column region in the intermediate region TR ($T_{CR} < T_{TR}$). In other words, it is possible to make the depth ($T_{CR}$) of the p-type column region PC1 in the cell region CR shallower than the depth ($T_{TR}$) of the p-type column region PC2 in the intermediate region TR ($T_{CR} < T_{TR}$). It is possible to alleviate (avoid) local current concentration of the avalanche currents by making the depth ($T_{CR}$) of the column region in the cell region shallow in this way and thereby it is possible to improve the avalanche resistance.

That is, in the present embodiment, the depth ($T_{CR}$) of the column region in the cell region is made shallower than the depth ($T_{TR}$) of the column region in the intermediate region TR. In general, a breakdown voltage $V_B$ is proportional to a depth (also called a column thickness) T in the column region. Therefore, the breakdown voltage of the cell region CR becomes lower than the breakdown voltage in the intermediate region TR by making the depth ($T_{CR}$) of the column region in the cell region shallower than the depth ($T_{TR}$) of the column region in the intermediate region.

Here, in the cell region CR, the source electrode SE and the source regions SR are coupled together via a plurality of coupling parts (the contact holes) (see FIG. 2). The plurality of coupling parts are provided, for example, in a region that the p-type column regions PC1 illustrated in FIG. 3 overlap the source electrode SE illustrated in FIG. 16. In the cell region CR, even when the avalanche current is generated, the current is dispersed and smoothly flows in this way. On the other hand, in the intermediate region TR, the number of current flow paths and the area of the flow paths are small and local current concentration is liable to occur. Therefore, even when the same avalanche current has flown in the cell region CR and the intermediate region TR, it may sometimes occur that it does not leads to breakage in the cell region CR and leads to the breakage in the intermediate region TR. According to the verifications by the inventors and others of the present application, a tendency that, for example, in evaluation of the avalanche resistance of actual devices, in the device which is low in avalanche resistance, breakage generation frequency is increased at the coupling parts in the intermediate region TR and in the device which is high in avalanche resistance, the breakage generation frequency is increased in the cell region CR is confirmed.

Accordingly, it is possible to avoid local current concentration and the breakage incidental to the local current concentration in the intermediate region TR by making the depth ($T_{CR}$) of the column region in the cell region CR shallower than the depth ($T_{TR}$) of the column region in the intermediate region TR so as to make the avalanche breakdown phenomenon preferentially occur in the cell region CR. Thereby, it is possible to improve the avalanche resistance (the avalanche current amount with which the semiconductor device comes to be broken) and it is possible to improve the reliability of the semiconductor device consequently.

Figure 22:
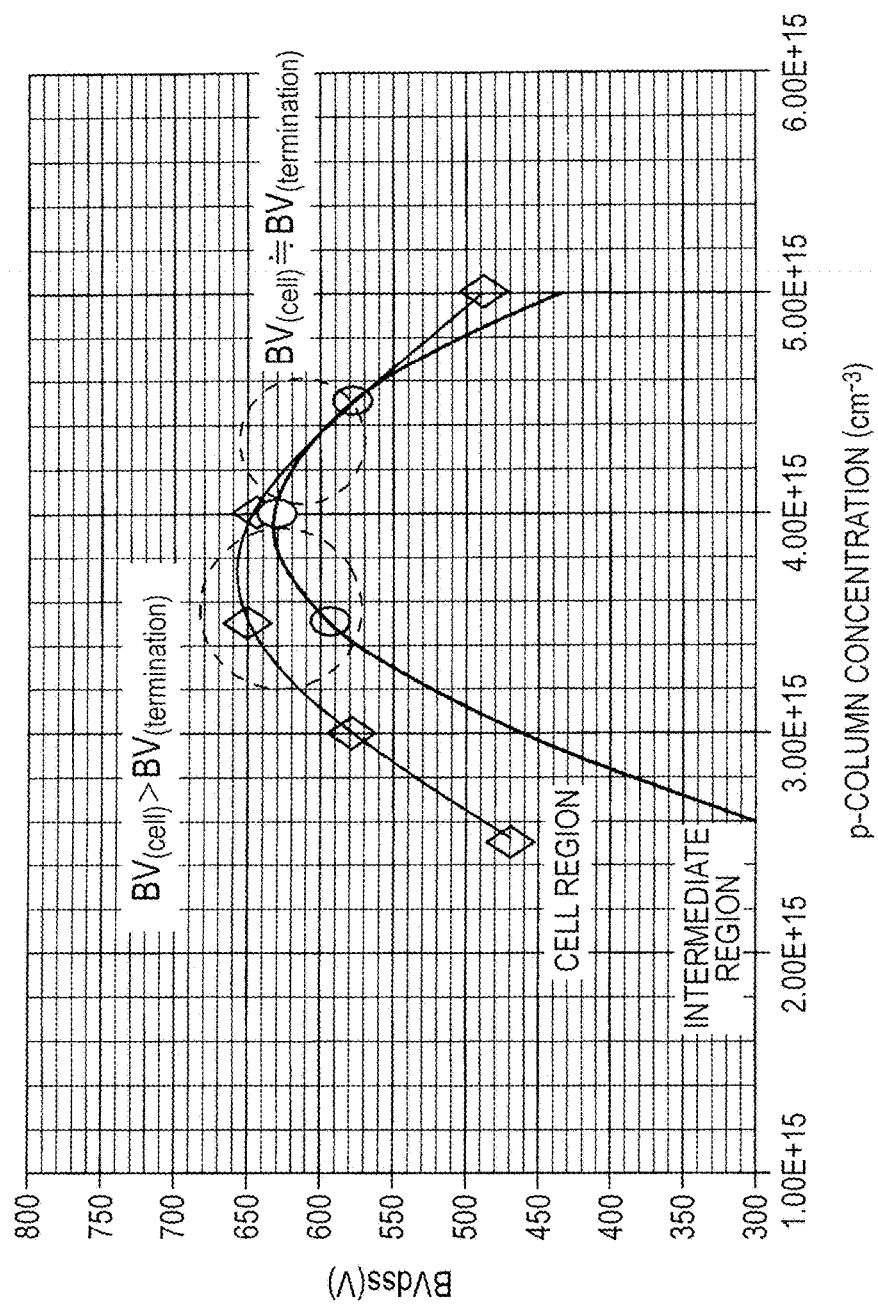
FIG. 22 is a graph illustrating one example of charge balance of a breakdown voltage (BVdss) of a p-n junction in a semiconductor device according to a comparative example.

FIG. 22 is a graph illustrating charge balance of a breakdown voltage (BVdss) of a p-n junction in a semiconductor device according to a comparative example. The vertical axis is the breakdown voltage (BVdss, (V)) of the p-n junction and the horizontal axis is the impurity concentration (the P-column concentration, ($cm^{-3}$)) of the p-type column region of the semiconductor device according to the comparative example. As illustrated in FIG. 22, in case of the comparative example that the depth ($T_{CR}$) of the column region in the cell region and the depth ($T_{TR}$) of the column region in the intermediate region are almost the same as each other, the breakdown voltage (BVdss) of the p-n junction in the cell region becomes higher than the breakdown voltage (BVdss) of the p-n junction in the intermediate region.

Figure 23:
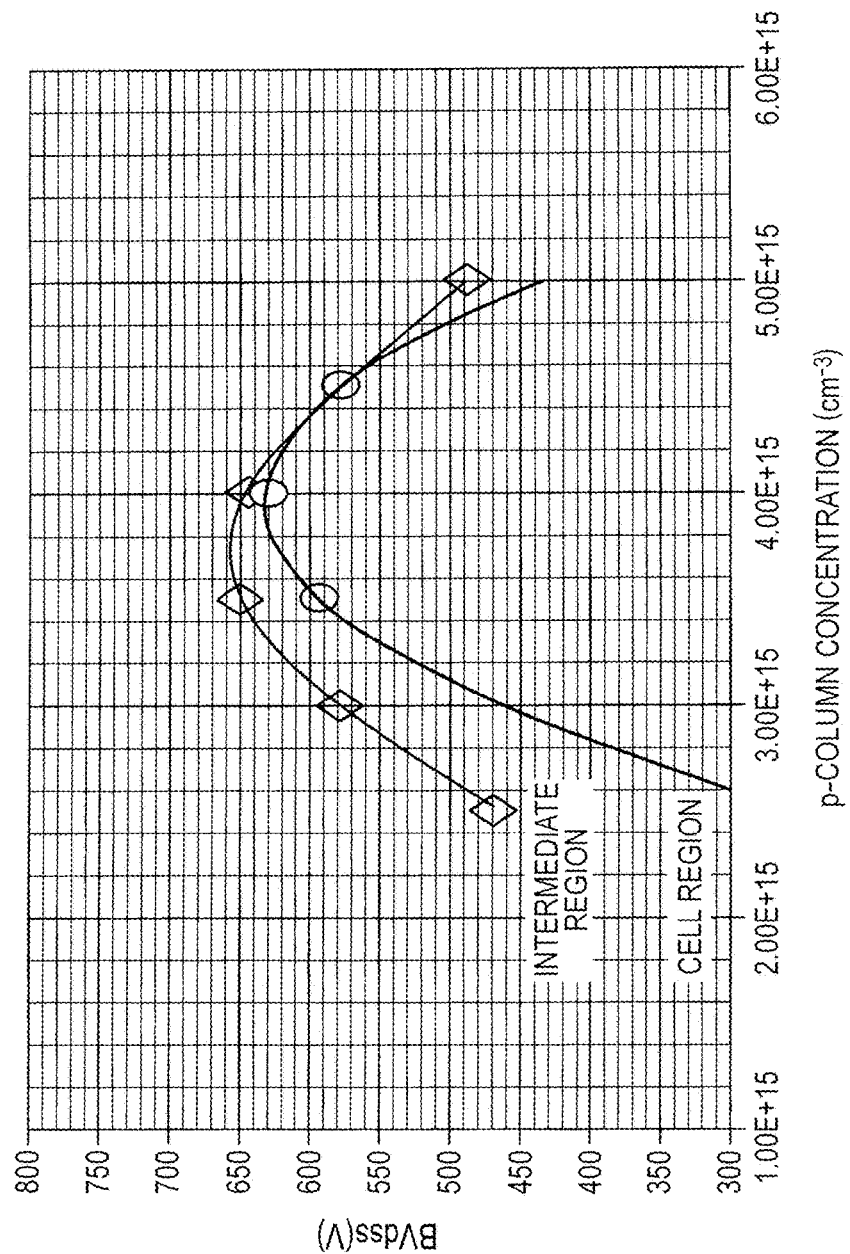
FIG. 23 is a graph illustrating one example of ideal charge balance of the breakdown voltage (BVdss) of the p-n junction attained by the semiconductor device according to the first embodiment.

In contrast, as illustrated in FIG. 23, it is preferable that at the concentration (for example, not more than about $4.2 \times 10^{15}/cm^{-3}$) of the impurity used in the p-type column region, the breakdown voltage (BVdss) of the p-n junction in the cell region become lower than the breakdown voltage (BVdss) of the p-n junction in the intermediate region. FIG. 23 is a graph illustrating ideal charge balance of the breakdown voltage (BVdss) of the p-n junction in the semiconductor device.

As mentioned above, the breakdown voltage of the p-n junction in the cell region becomes lower than the breakdown voltage of the p-n junction in the intermediate region by making the depth ($T_{CR}$) of the column region in the cell region CR shallower than the depth ($T_{TR}$) of the column region in the intermediate region TR. In other words, the avalanche breakdown voltage of the p-n junction in the cell region CR becomes lower than the avalanche breakdown voltage of the p-n junction in the intermediate region TR. Consequently, the ideal charge balance as illustrated in FIG. 23 is attained in this way. Thereby, as mentioned above, it is possible to make the avalanche breakdown phenomenon preferentially generate in the cell region CR and thereby it is possible to avoid the local current concentration and the breakage incidental to occurrence of the local current concentration in the intermediate region TR.

In addition, as illustrated in FIG. 22 and FIG. 23, the charge balance of the breakdown voltage (BVdss) of the p-n junction is changed depending on the impurity concentration of the p-type column region. Accordingly, it is possible to compensate for a reduction in breakdown voltage caused by a variation in impurity concentration of the p-type column region by improving the avalanche resistance as in the present embodiment and consequently it is possible to widen a process margin when manufacturing the semiconductor device.

Second Embodiment

In the present embodiment, various application examples will be described. Incidentally, the same or relevant symbols are assigned to the same parts as those in the first embodiment and so forth and repetitive description thereon is omitted.

APPLICATION EXAMPLE 1

Figure 24:
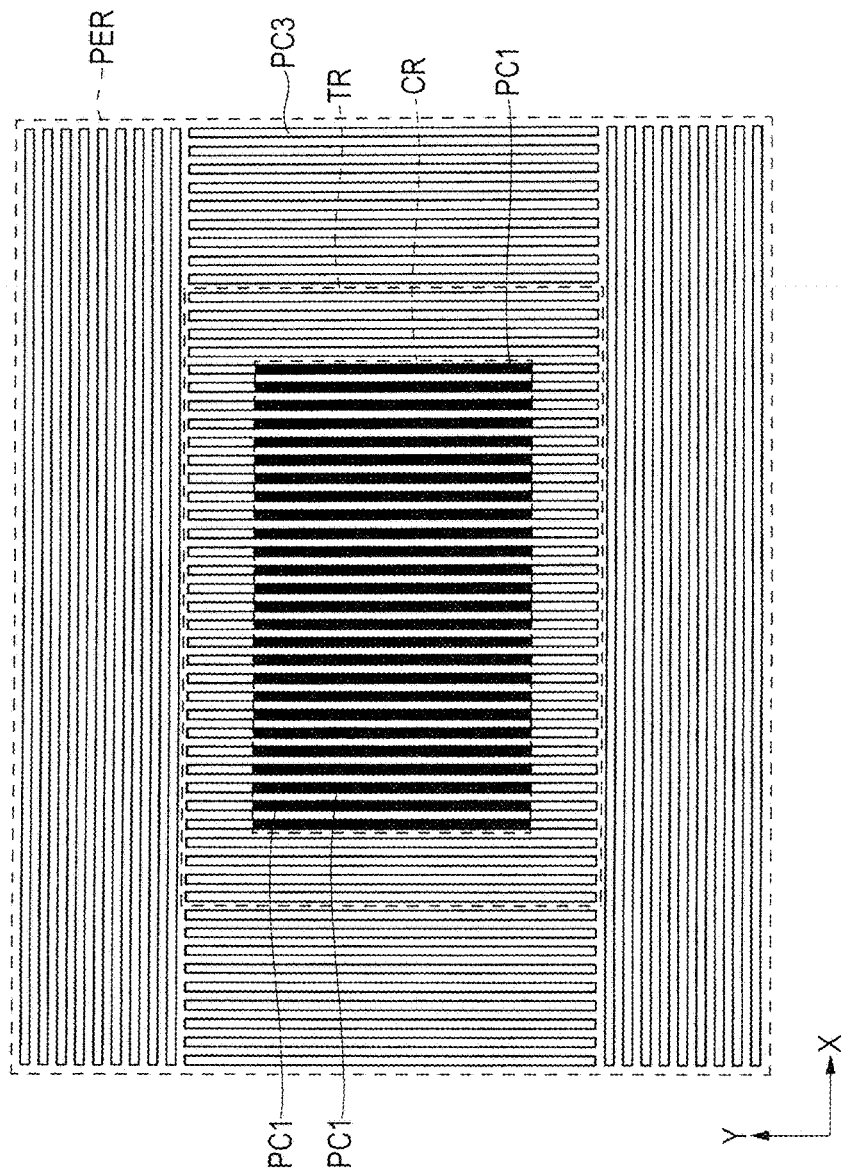
FIG. 24 is a plan view illustrating one example of a configuration of a semiconductor device according to an application example 1 of a second embodiment.
Figure 25:
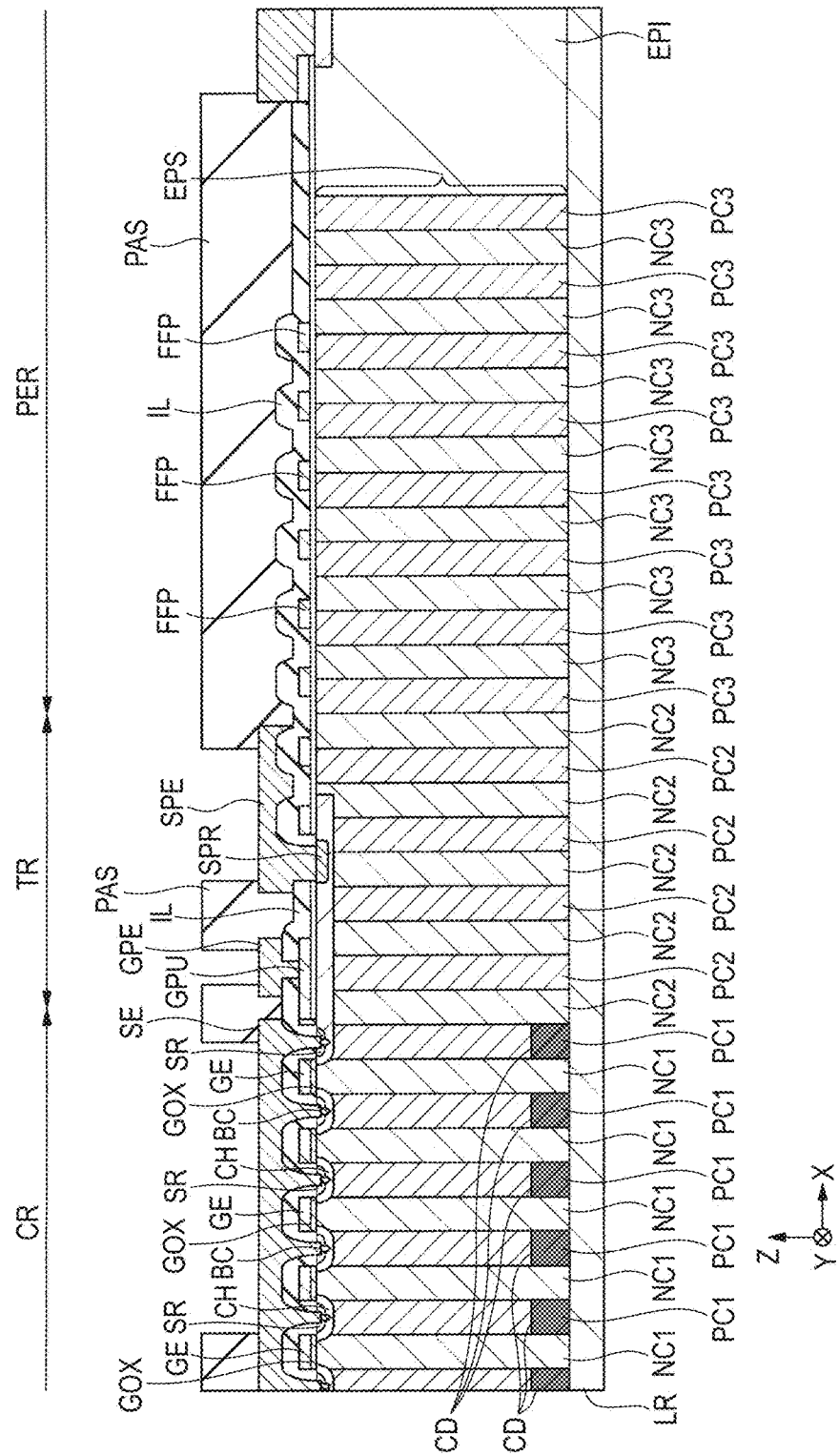
FIG. 25 is a sectional diagram illustrating one example of the configuration of the semiconductor device according to the application example 1 of the second embodiment.

FIG. 24 is a plan view illustrating one example of a configuration of a semiconductor device according to an application example 1 of the present embodiment. FIG. 25 is a sectional diagram illustrating one example of the configuration of the semiconductor device according to the application example 1 of the present embodiment.

Although, in the first embodiment (FIG. 20), the counter doped region CD is formed by implanting the n-type impurity ions into the entire (for example, the entire of the rectangular cell region CD illustrated in FIG. 3) of the cell region CR, the n-type impurity ions may be implanted only to the p-type column region PC1 formation region in the cell region CR as illustrated in FIG. 24. In FIG. 24, a dark gray part indicates a region into which the n-type impurity ions have been implanted. In this case, the n-type impurity ions are implanted via a screening mask having openings, for example, only for the p-type column regions PC1 in the cell region CR.

By performing the ion implanting step as mentioned above, the counter doped region CD is formed only under each p-type column region PC1 as illustrated in FIG. 25. Also in this case, the effect of the p-type impurity is cancelled out on the lower part of each p-type column region PC1 in the cell region CR and the effective p-type impurity concentration of each p-type column region PC1 is reduced. Accordingly, the depth (the dimension in the Z direction, TCR) of the p-type column region PC1 in the cell region CR becomes shallower than the depth (the dimension in the Z direction, TTR) of the p-type column region PC2 in the intermediate region TR and it is possible to obtain the same advantageous effects as those in the first embodiment.

Incidentally, since the application example 1 is the same as the first embodiment excepting the configuration of the counter doped region CD and the manufacturing process thereof, description on the same configuration and the same manufacturing process thereof is omitted.

APPLICATION EXAMPLE 2

Figure 26:
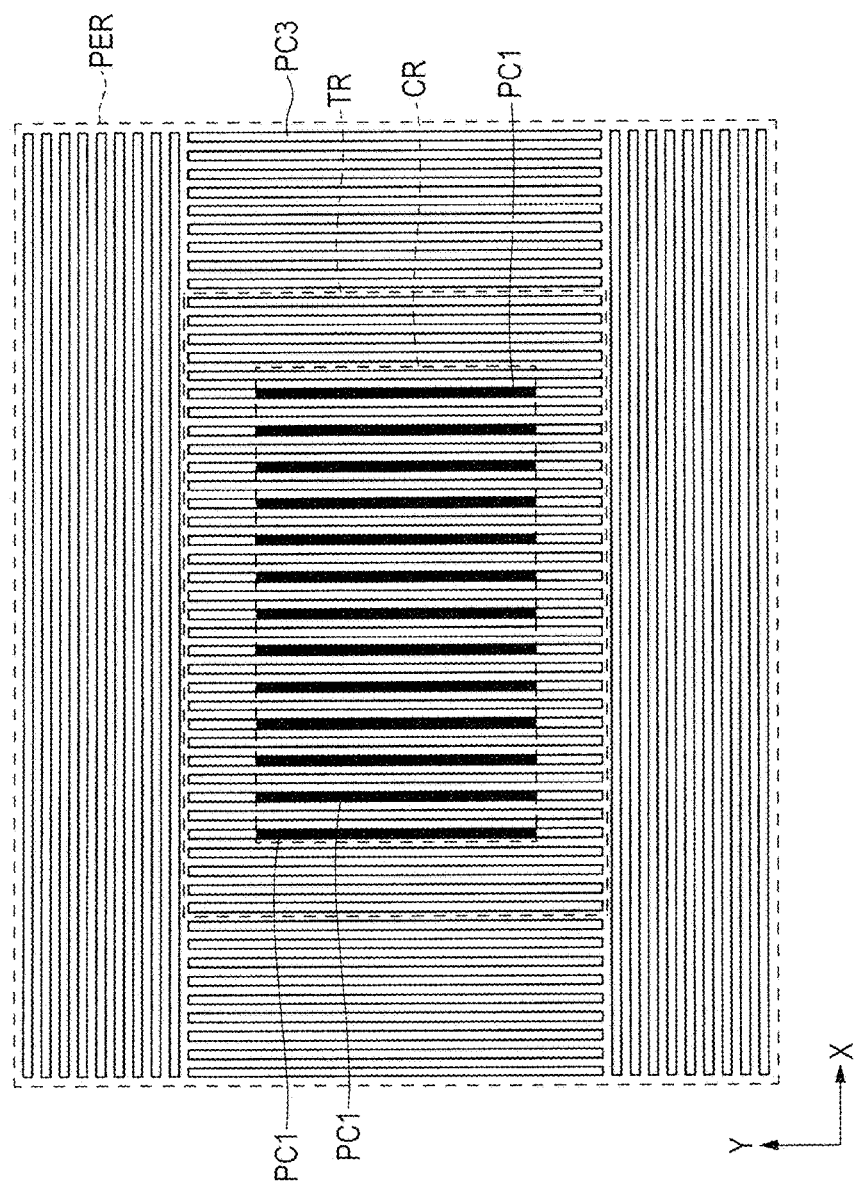
FIG. 26 is a plan view illustrating one example of one configuration of a semiconductor device according to an application example 2 of the second embodiment.
Figure 27:
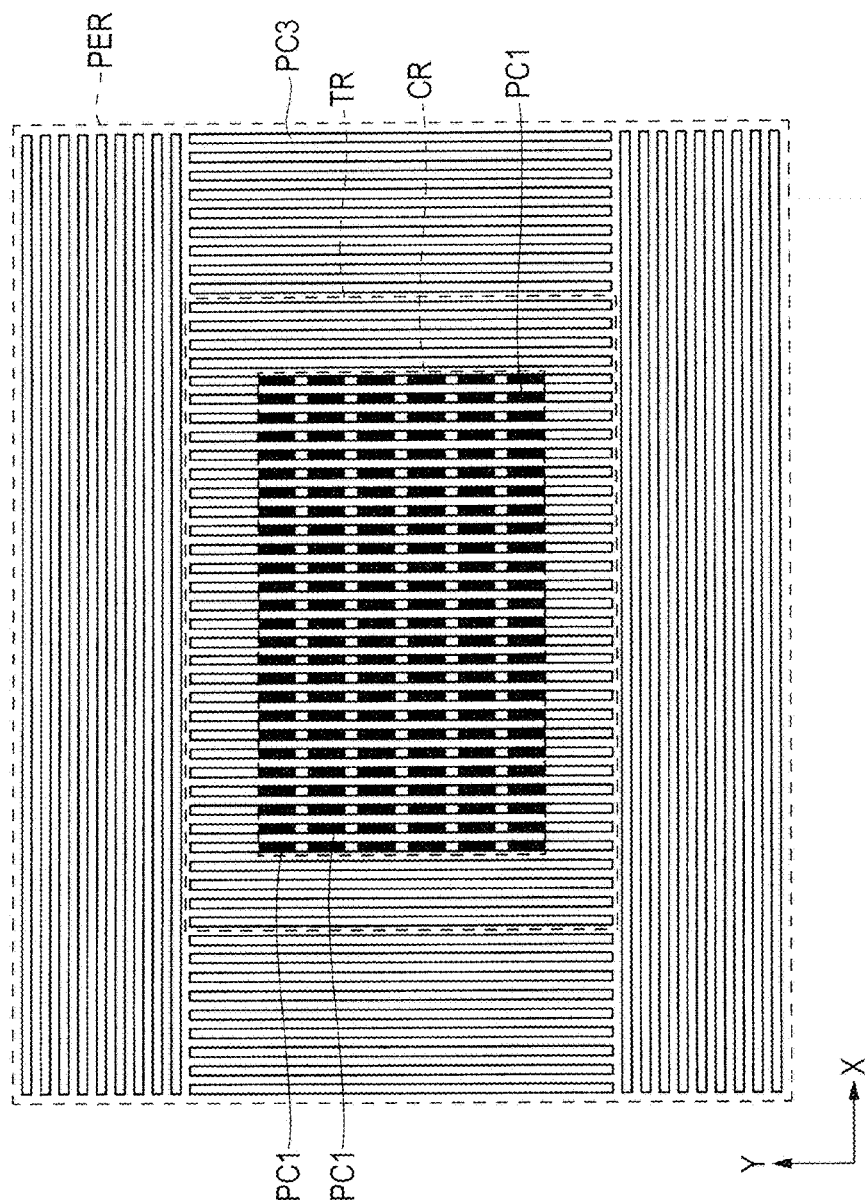
FIG. 27 is a pan view illustrating one example of another configuration of the semiconductor device according to the application example 2 of the second embodiment.

FIG. 26 is a plan view illustrating one example of one configuration of a semiconductor device according to an application example 2 of the present embodiment. FIG. 27 is a plan view illustrating one example of another configuration of the semiconductor device according to the application example 2 of the present embodiment.

Although, in the application example 1 (FIG. 24), the n-type impurity ions are implanted into all of the p-type column region PC1 formation regions, the n-type impurity ions may be implanted into some of the p-type column region PC1 formation regions.

In FIG. 26 and FIG. 27, a dark gray part indicates a region that the n-type impurity ions have been implanted. For example, as illustrated in FIG. 26, the n-type impurity ions may be implanted into only every other p-type column region PC1 formation region in the plurality of p-type column region PC1 formation regions which are arranged in the X direction at predetermined intervals.

In addition, as illustrated in FIG. 27, n-type impurity ion implanted regions and n-type impurity ion not-implanted regions may be alternately provided in the linear (the rectangle having the long side in the Y direction) n-type column regions PC1.

Also in this case, it is possible to reduce the depths (the dimensions in the Z direction, TCR) of some of the p-type column regions PC1 in the cell region CR and thereby it is possible to improve the avalanche resistance (the avalanche current amount with which the semiconductor device comes to be broken).

Incidentally, since the application example 2 is the same as the first embodiment excepting the configuration of the n-type impurity ion implanted region (the counter doped region CD) and the manufacturing process thereof, description on the same configuration and the same manufacturing process is omitted.

APPLICATION EXAMPLE 3

Figure 28:
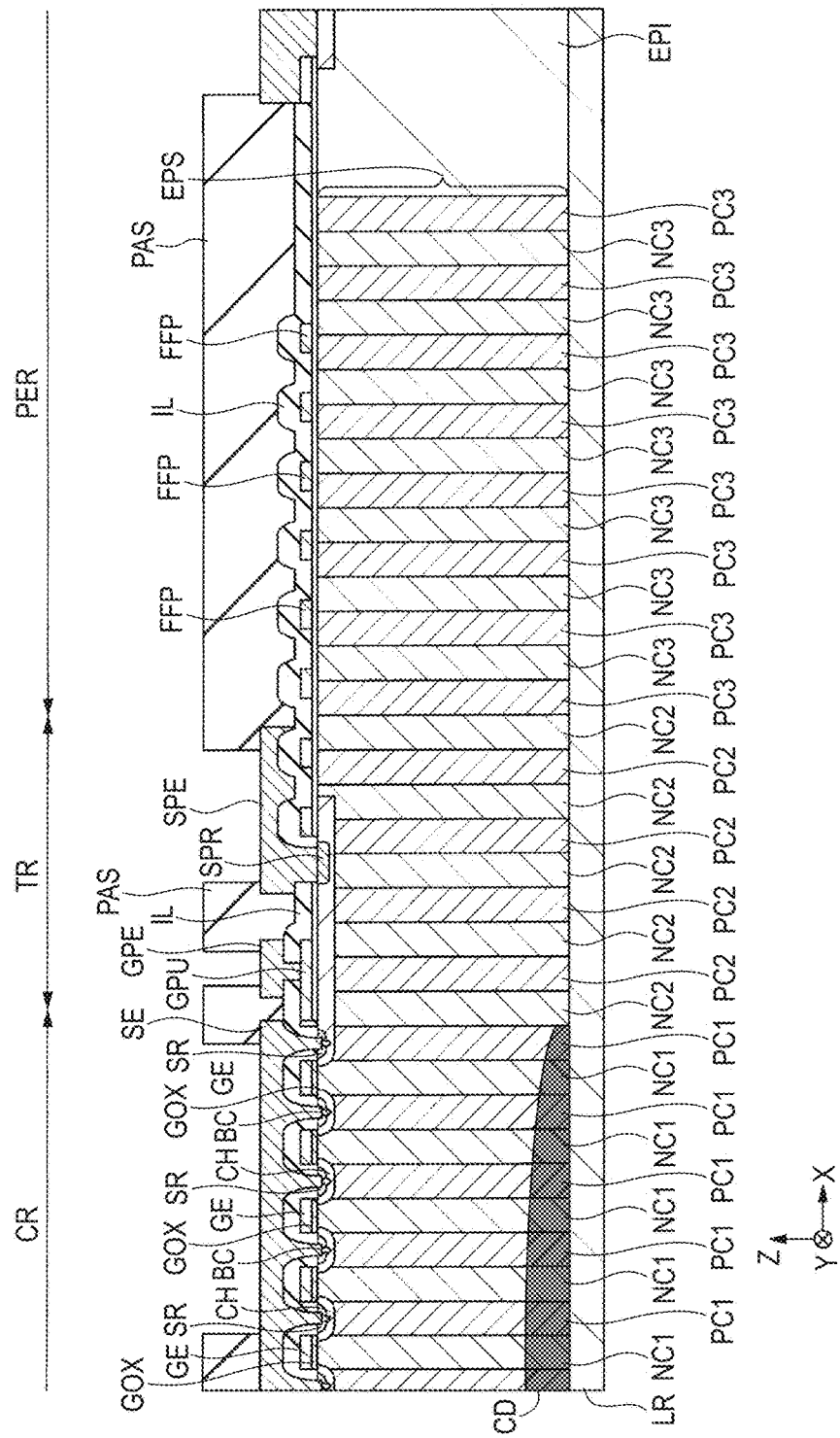
FIG. 28 is a sectional diagram illustrating one example of a configuration of a semiconductor device according to an application example 3 of the second embodiment.

FIG. 28 is a sectional diagram illustrating one example of a configuration of a semiconductor device according to an application example 3 of the present embodiment. As illustrated in FIG. 28, the thickness of the counter doped region CD may be changed. Here, the thickness of the counter doped region CD is gradually reduced as it goes from the central part toward the outer peripheral part of the cell region CR. Thereby, the closer to the intermediate region TR the p-type column region CD in the cell region is located, the more the depth (the dimension in the Z direction, $T_{CR}$) thereof is gradually increased.

Also in this case, it is possible to improve the avalanche resistance (the avalanche current amount with which the semiconductor device comes to be broken) and thereby it is possible to improve the reliability of the semiconductor device.

Incidentally, since the application example 3 is the same as the first embodiment excepting the configuration of the n-type impurity ion implanted region (the counter doped region CD) and the manufacturing process thereof, description on the same configuration and the same manufacturing process is omitted.

APPLICATION EXAMPLE 4

Figure 29:
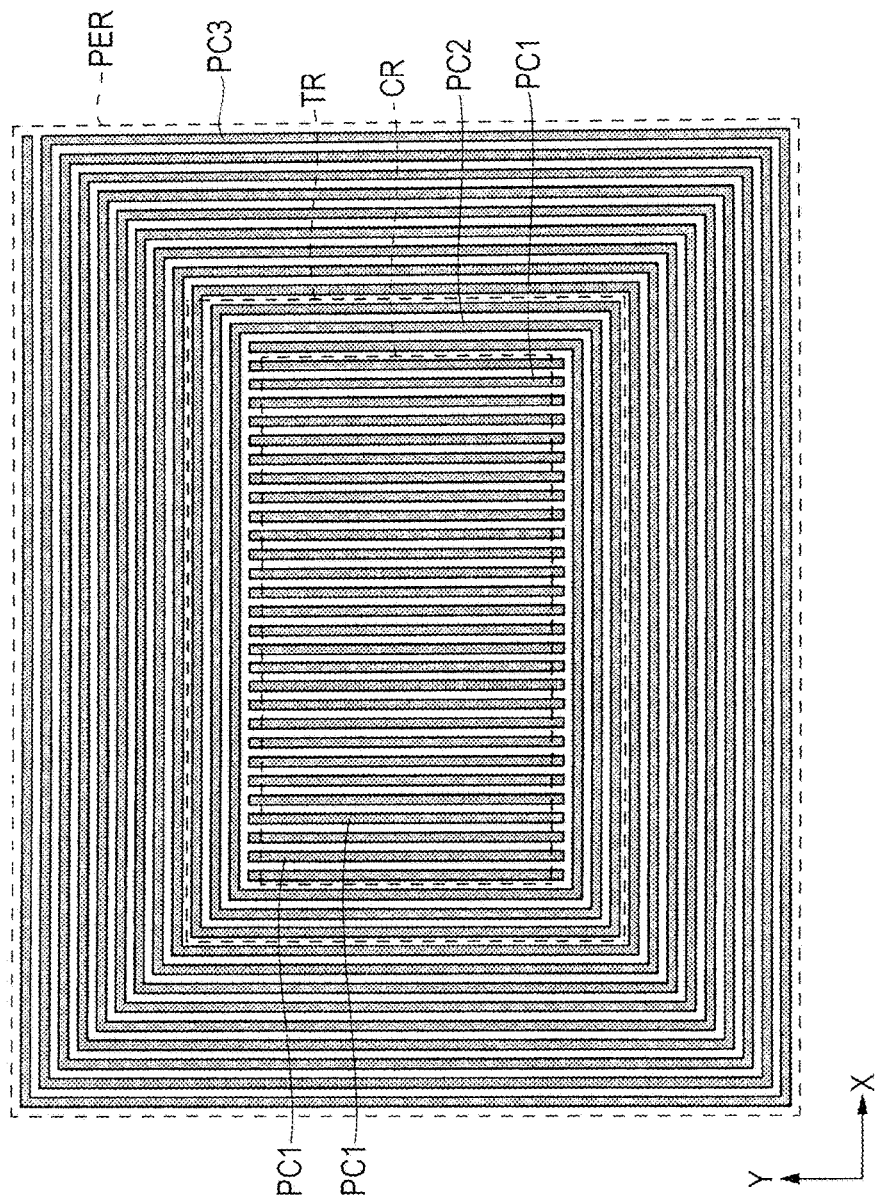
FIG. 29 is a plan view illustrating one example of a configuration of a semiconductor device according to an application example 4 of the second embodiment.

FIG. 29 is a plan view illustrating one example of a configuration of a semiconductor device according to an application example 4 of the present embodiment.

Although in the first embodiment (FIG. 3), the p-type column regions PC2 and PC3 are formed into the linear shape (the rectangle having the long side in the X direction or the Y direction) in the intermediate region TR and the peripheral region PER, the p-type column regions PC2 and PC3 may be formed into a spiral shape, for example, as illustrated in FIG. 29. The spiral shape is a shape drawn with a single stroke of the brush.

That is, as illustrated in FIG. 29, in the intermediate region TR, a first-turn section of one p-type column (a section of one p-type column to be arranged as a first turn) is arranged so as to surround the cell region CR, starting from a corner (a starting point, an initial point and so forth) of the rectangular region which defines the cell region CR and a send-turn section of the p-type column is arranged so as to surround the first-turn section of the p-type column contiguously to the first-turn section of the p-type column. Further, a third-turn section of the p-type column is arranged so as to surround the second-turn section of the p-type column contiguously to the second-turn section of the p-type column. That is, an n-th turn section of the p-type column is arranged so as to surround an n-1-th turn section of the p-type column in this way and the intermediate region TR is configured by the P-type column which has been spirally wound by the n turns so as to surround the previously arranged sections of the p-type column. In FIG. 29, the first-turn section to the third-turn section of the p-type column are illustrated (n=3).

In addition, in the peripheral region PER, another first-turn section of the p-type column is arranged so as to surround the intermediate region TR, starting from the corner (the starting point, the initial point and so forth) of the rectangular region which defines the intermediate region TR and another second-turn section of the p-type column is arranged so as to surround the first-turn section of the p-type column contiguously to the first-turn section of the p-type column. Further, another third-turn section of the p-type column is arranged so as to surround the second-turn section of the p-type column contiguously to the second-turn section of the p-type column. That is, another n-th turn section of the p-type column is arranged so as to surround another n-1-th turn section of the p-type column in this way and the intermediate region TR comes to be surrounded by the P-type column which has been spirally wound by the n turns. In FIG. 29, the first-turn section to a ninth-turn section of the p-type column are illustrated (n=9).

As described above, even in case of spiral arrangement of the p-type column regions PC2 and PC3 in the intermediate region TR and the peripheral region PER as mentioned above, it is possible to attain the same advantageous effects as those in the first embodiment by making the depth (the dimension in the Z direction, $T_{CR}$) of the p-type column region PC1 in the cell region CR shallower than the depths (the dimensions in the Z direction, $T_{RE}$ and $T_{PER}$) of the p-type column regions PC2 and PC3 in the intermediate region TR and the peripheral region PER.

In addition, although in the first embodiment, the n-type semiconductor region (the low resistance region) is formed by implanting the ions of the n-type impurity into the back surface of the semiconductor substrate 1S, this step may be omitted.

In addition, although in the first embodiment, the back surface of the semiconductor substrate 1S is ground so as to leave the semiconductor substrate 1S, the back surface may be ground until the epitaxial layer EPS is exposed. In this case, the n-type impurity ions may be implanted into an exposed surface of the epitaxial layer EPS to form the n-type semiconductor region (the low resistance region) LR and the counter doped region CD may be formed under the n-type semiconductor region LR by, for example, back surface selective implantation and so forth.

Although, in the foregoing, the invention which has been made by the inventors and others of the present invention has been specifically described on the basis of the embodiments, it goes without saying that the present invention is not limited to the embodiments described so far and may be varied in a variety of ways within a scope not deviating from the gist thereof. For example, the configurations of the application examples 1 to 4 may be appropriately combined together and the configurations so combined may be applied to the first embodiment.

What is claimed is:

1. A manufacturing method for semiconductor devices, comprising the steps of:
   (a) forming a plurality of first ditches in a first region of a first conductivity type semiconductor layer and forming a plurality of second ditches in a second region which surrounds the first region of the semiconductor layer;
   (b) embedding a semiconductor of a second conductivity type which is a reverse conductivity type of the first conductivity type in the first ditches and the second ditches thereby
   (b1) forming a first pillar in each of the first ditches and forming a second pillar which is configured by the semiconductor layer between the first pillars, and
   (b2) forming a third pillar in each of the second ditches and forming a fourth pillar which is configured by the semiconductor layer between the third pillars;
   (c) forming a semiconductor element in the first region; and
   (d) implanting an impurity of the first conductivity type into a lower part of each of the first pillars in the first ditches,
   wherein the step (d) is the step of implanting the impurity of the first conductivity type in a state where the bottom side of each first ditch in the semiconductor layer is turned upward as an upper surface and the second region is left covered with a mask.

2. The manufacturing method for semiconductor devices according to claim 1,
   wherein owing to execution of the step (d), a depth of the first pillar which is a depth of a region of the first conductivity type in the first ditch becomes shallower than a depth of the third pillar which is a depth of a region of the first conductivity type in the second ditch.

3. The manufacturing method for semiconductor devices according to claim 1,
   wherein the step (c) includes the steps of
   (c1) forming a gate electrode over the second pillar via a gate insulating film, and
   (c2) forming a source region over an upper part of the first pillar located on one side of the second pillar.

4. The manufacturing method for semiconductor devices according to claim 3, further comprising the step of:
   (e) forming a source electrode to be coupled with the source region.

* * * * *